United States Patent
Watanabe et al.

(10) Patent No.: US 12,132,061 B2
(45) Date of Patent: Oct. 29, 2024

(54) SEMICONDUCTOR DEVICE, IMAGING DEVICE, AND METHOD OF MANUFACTURING SEMICONDUCTOR DEVICE

(71) Applicant: SONY SEMICONDUCTOR SOLUTIONS CORPORATION, Kanagawa (JP)

(72) Inventors: Tsuyoshi Watanabe, Kanagawa (JP); Hirokazu Nakayama, Kanagawa (JP); Hiroyuki Shigeta, Kanagawa (JP); Hitoshi Shibue, Kanagawa (JP); Hirotaka Kobayashi, Kanagawa (JP); Kosuke Hareyama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 459 days.

(21) Appl. No.: 17/435,239

(22) PCT Filed: Feb. 5, 2020

(86) PCT No.: PCT/JP2020/004376
§ 371 (c)(1),
(2) Date: Aug. 31, 2021

(87) PCT Pub. No.: WO2020/184002
PCT Pub. Date: Sep. 17, 2020

(65) Prior Publication Data
US 2022/0139979 A1    May 5, 2022

(30) Foreign Application Priority Data
Mar. 13, 2019  (JP) ................. 2019-045875

(51) Int. Cl.
*H01L 27/146*  (2006.01)
*H01L 31/024*  (2014.01)

(52) U.S. Cl.
CPC .. *H01L 27/14618* (2013.01); *H01L 27/14683* (2013.01); *H01L 31/024* (2013.01)

(58) Field of Classification Search
CPC ......... H01L 27/14618; H01L 27/14683; H01L 31/024; H01L 23/04; H01L 23/053; H01L 23/4275
See application file for complete search history.

(56) References Cited

U.S. PATENT DOCUMENTS 10,447,059 B2 * 10/2019 Yajima ................. H02J 7/0071
2008/0111234 A1   5/2008 Hua
(Continued)

FOREIGN PATENT DOCUMENTS

CN    105393651 A    3/2016
DE    102015212571 A1  1/2017
(Continued)

OTHER PUBLICATIONS

International Search Report and Written Opinion of PCT Application No. PCT/JP2020/004376, issued on Mar. 31, 2020, 10 pages of ISRWO.

*Primary Examiner* — Kyoung Lee
*Assistant Examiner* — Sophia W Kao
(74) *Attorney, Agent, or Firm* — CHIP LAW GROUP

(57) ABSTRACT

An improvement in heat radiation efficiency is achieved. A semiconductor device according to the present technology includes a substrate portion on which a semiconductor chip is mounted and in which an external connection terminal for performing electrical connection to the outside is formed on a rear surface on a side opposite to a front surface which is a surface on a side where the semiconductor chip is (Continued)

mounted, an outer wall portion that protrudes toward the front surface side in an outer circumferential portion of the substrate portion, a lid portion which is supported by the outer wall portion and covers the semiconductor chip, and a heat storage member which is disposed at a position further inside than the outer wall portion between the rear surface of the substrate portion and a rear surface of the lid portion.

16 Claims, 33 Drawing Sheets

(56) References Cited

U.S. PATENT DOCUMENTS

| | | |
|---|---|---|
| 2009/0046184 A1 | 2/2009 | Ma |
| 2012/0280382 A1* | 11/2012 | Im ..................... H01L 23/3128 |
| | | 257/E23.11 |
| 2016/0156213 A1 | 6/2016 | Yajima et al. |
| 2020/0118990 A1* | 4/2020 | Xu ..................... H01L 23/5383 |

FOREIGN PATENT DOCUMENTS

| | | | |
|---|---|---|---|
| JP | 10-041595 | A | 2/1998 |
| JP | 2008-041756 | A | 2/2008 |
| JP | 2008-041759 | A | 2/2008 |
| JP | 2008-278330 | A | 11/2008 |
| JP | 2015-029036 | A | 2/2015 |
| JP | 2015198319 | A * | 11/2015 |
| WO | 2014/208066 | A2 | 12/2014 |
| WO | 2015/198770 | A1 | 12/2015 |

\* cited by examiner

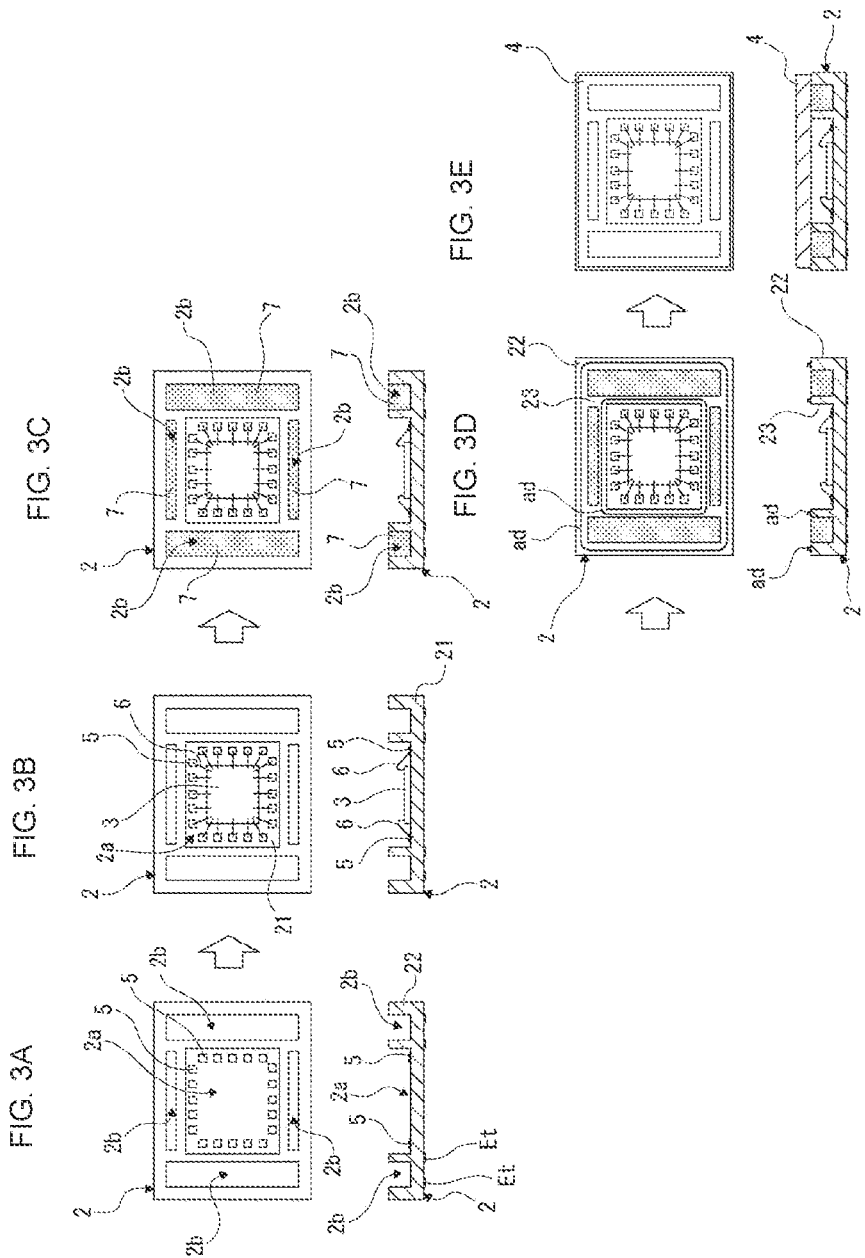

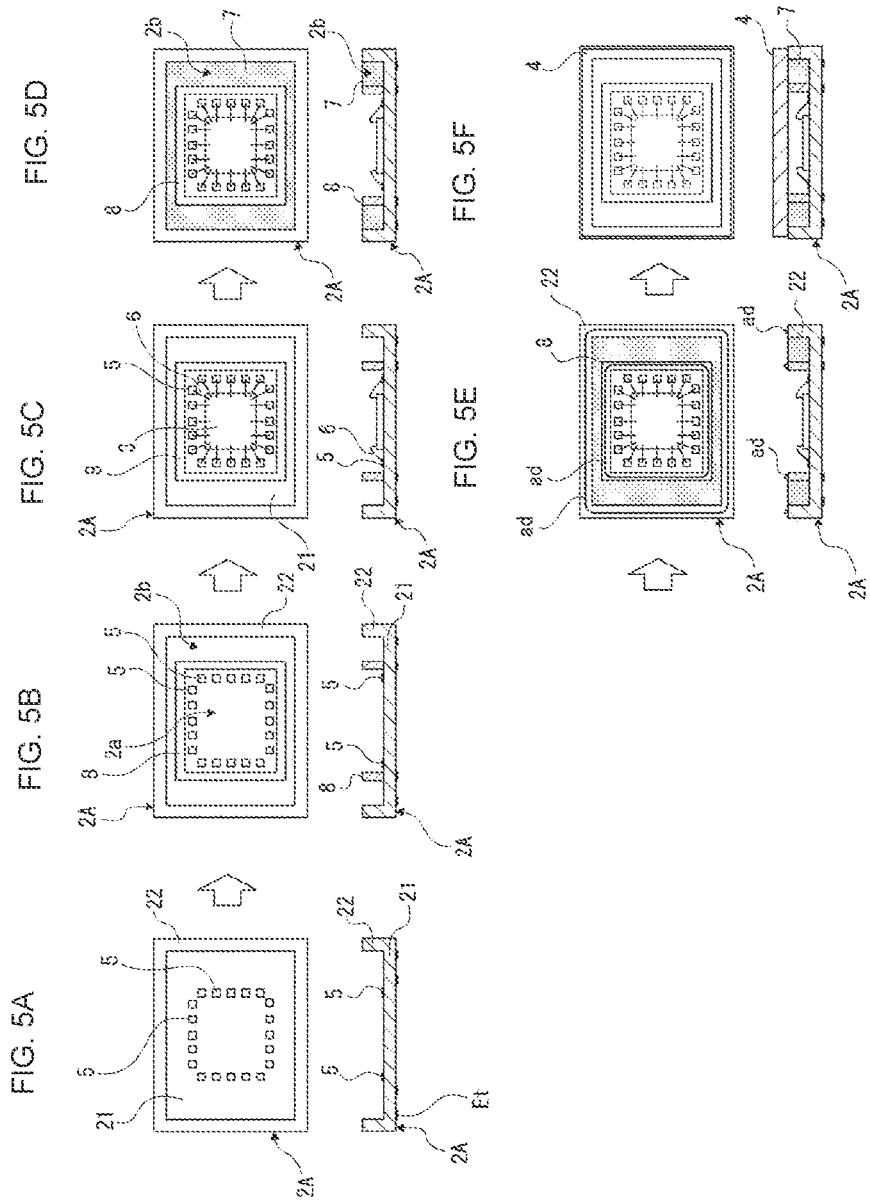

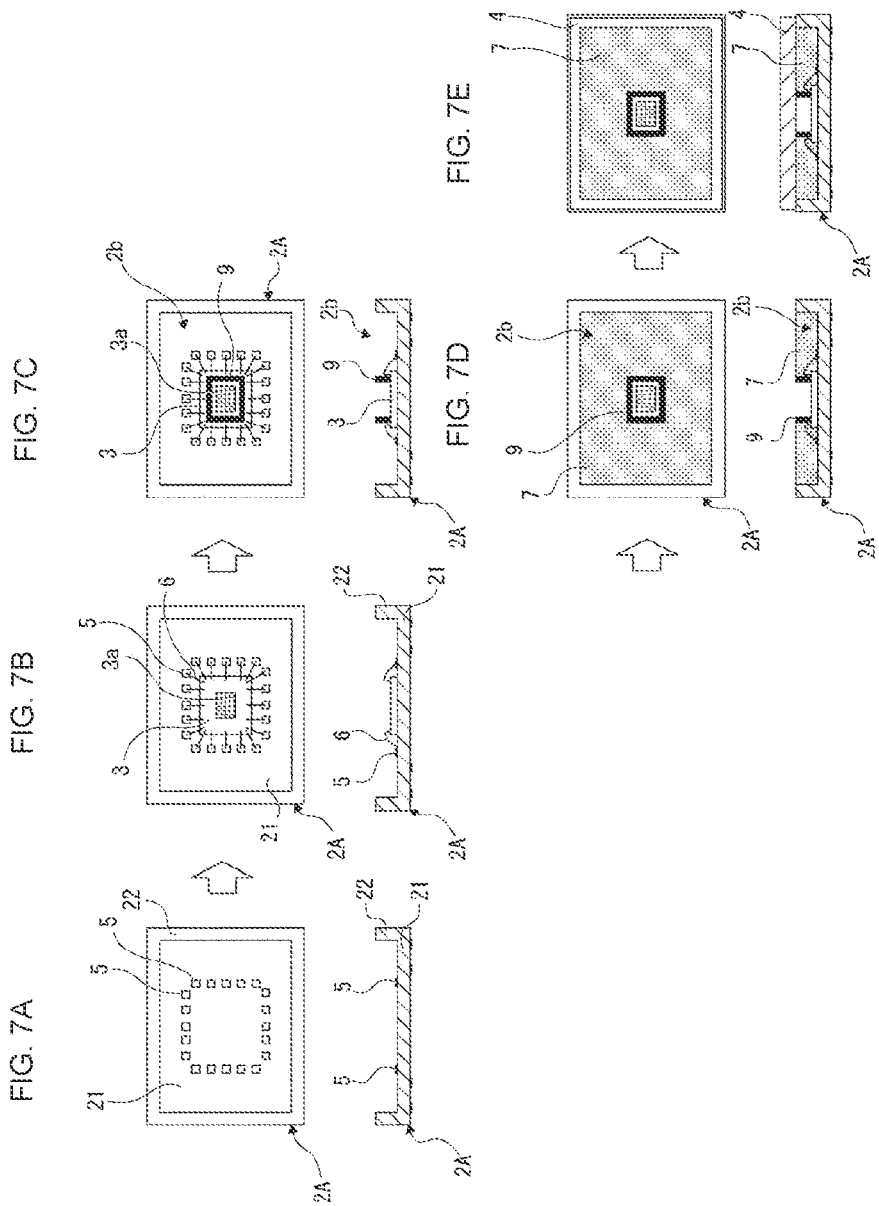

SEMICONDUCTOR DEVICE, IMAGING DEVICE, AND METHOD OF MANUFACTURING SEMICONDUCTOR DEVICE

CROSS REFERENCE TO RELATED APPLICATIONS

This application is a U.S. National Phase of International Patent Application No. PCT/JP2020/004376 filed on Feb. 5, 2020, which claims priority benefit of Japanese Patent Application No. JP 2019-045875 filed in the Japan Patent Office on Mar. 13, 2019. Each of the above-referenced applications is hereby incorporated herein by reference in its entirety.

TECHNICAL FIELD

The present technology relates to a semiconductor device in which a semiconductor chip is mounted on a substrate portion, an imaging device including the semiconductor device as a solid state imaging element, and a method of manufacturing the semiconductor device, and more particularly, to a technique for radiating heat generated from the semiconductor chip using a heat storage material.

BACKGROUND ART

A semiconductor device in which a semiconductor chip is mounted on a substrate portion is configured to radiate heat generated from the semiconductor chip using a heat storage material. For example, in a semiconductor device used as a solid state imaging element (image sensor), there have been attempts to add a heat storage material to a portion of the semiconductor device as disclosed in the following PTL 1 and PTL 2.

Specifically, PTL 1 discloses a technique for externally attaching a heat storage member obtained by insert-molding a heat storage material to a semiconductor device.

In addition, PTL 2 discloses a technique for filling a resin frame constituting a semiconductor package with a heat storage material.

CITATION LIST

Patent Literature

[PTL 1]
  JP 2008-278330A
[PTL 2]
  JP 2015-198319A

SUMMARY

Technical Problem

However, in a case where a heat storage member is externally attached to a semiconductor device as disclosed in PTL 1, it is necessary to secure a space for attaching the heat storage member, and a heat storage material is bonded through an adhesive or a resin, thereby making it difficult to sufficiently radiate heat.

Further, in a configuration in which a resin frame surrounding a semiconductor chip is filled with a heat storage material as disclosed in PTL 2, most heat generated from a chip passes through a substrate and then reaches the heat storage material through the resin frame, and thus it is difficult to sufficiently radiate heat. Further, in order to secure the strength of the resin frame, heat storage materials which can be filled in the resin frame are limited, and this also makes it difficult to sufficiently radiate heat in this respect.

The present technology is contrived in view of the above-described circumstances, and an object thereof is to improve heat radiation efficiency.

Solution to Problem

A semiconductor device according to the present technology includes a substrate portion on which a semiconductor chip is mounted and in which an external connection terminal for performing electrical connection to an outside is formed on a rear surface on a side opposite to a front surface which is a surface on a side where the semiconductor chip is mounted, an outer wall portion that protrudes toward the front surface side in an outer circumferential portion of the substrate portion, a lid portion which is supported by the outer wall portion and covers the semiconductor chip, and a heat storage member which is disposed at a position further inside than the outer wall portion between the rear surface of the substrate portion and a rear surface of the lid portion.

Thereby, the heat storage member can be disposed closer to the semiconductor chip that is a heat source, as compared to a case where the heat storage member is externally attached to the semiconductor device or a case where the heat storage member is disposed inside the outer wall portion.

In the above-described semiconductor device according to the present technology, it is conceivable to adopt a configuration in which the substrate portion is formed of a ceramic.

Thereby, heat generated from the semiconductor chip is efficiently transferred to the heat storage member through the substrate portion.

In the above-described semiconductor device according to the present technology, it is conceivable to adopt a configuration in which the semiconductor device further includes an inner wall portion which is positioned on an inner side of the outer wall portion and protrudes toward a side in the same direction as the outer wall portion, and the heat storage member is formed between the outer wall portion and the inner wall portion.

Thereby, the heat storage material filled in a space between the outer wall portion and the inner wall portion can be sealed by the lid portion.

In the above-described semiconductor device according to the present technology, it is conceivable to adopt a configuration in which the inner wall portion is formed by a frame member provided on the semiconductor chip.

Thereby, a portion of the semiconductor chip can be covered with the heat storage member.

In the above-described semiconductor device according to the present technology, it is conceivable to adopt a configuration in which the semiconductor chip includes a pixel region in which a plurality of light receiving elements are arranged two-dimensionally, and the frame member surrounds an outer side of the pixel region on the semiconductor chip.

Thereby, a portion of the outer side of the pixel region on the semiconductor chip can be covered with the heat storage member.

In the above-described semiconductor device according to the present technology, it is conceivable to adopt a configuration in which the heat storage member is disposed at a position further inside than the outer wall portion inside the substrate portion.

Most heat generated from the semiconductor chip is transferred to the substrate portion.

In the above-described semiconductor device according to the present technology, it is conceivable to adopt a configuration in which the substrate portion has a multi-layered structure, and the heat storage member is formed in a notch portion formed in any one layer in the substrate portion.

Thereby, a portion to be filled with the heat storage material can be easily formed in a process.

In the above-described semiconductor device according to the present technology, it is conceivable to adopt a configuration in which the substrate portion has a multi-layered structure, and the heat storage member is formed in a plurality of layers in the substrate portion.

Thereby, a portion restricted by a wiring layout due to the arrangement of the heat storage member in the substrate portion is prevented from being biased to a single layer.

In the above-described semiconductor device according to the present technology, it is conceivable to adopt a configuration in which a concave portion recessed on a front surface side is formed on the rear surface side of the substrate portion, an electronic component different from the semiconductor chip is mounted in the concave portion, and the electronic component is covered with the heat storage member in the concave portion.

Thereby, in a case where an electronic component serving as a heat source is mounted on each of the front and rear surfaces of the substrate portion as an interposer substrate, heat generated from the electronic components is efficiently transferred to the heat storage material through the substrate portion.

In the above-described semiconductor device according to the present technology, it is conceivable to adopt a configuration in which the semiconductor device includes a closing member that closes the concave portion.

Thereby, the heat storage material undergoing a phase transition in accordance with temperature can be used without being contained in microcapsules or covered with a resin.

In the above-described semiconductor device according to the present technology, it is conceivable to adopt a configuration in which the semiconductor device further includes a cooling element which is disposed at a position facing the semiconductor chip on the rear surface side of the substrate portion.

With the above-described configuration, heat generated from the semiconductor chip is efficiently transferred to the cooling element through the substrate portion.

In the above-described semiconductor device according to the present technology, it is conceivable to adopt a configuration in which the heat storage member is disposed between the cooling element and the semiconductor chip.

Thereby, heat transfer from the semiconductor chip to the cooling element is efficiently performed through the heat storage member positioned between the cooling element and the semiconductor chip.

In the above-described semiconductor device according to the present technology, it is conceivable to adopt a configuration in which the heat storage member is constituted by a heat storage material undergoing a phase transition in accordance with temperature, and the semiconductor device includes a detection element that detects a phase transition of the heat storage member, and a cooling element.

Thereby, it is possible to perform temperature management by driving the cooling element on the basis of a phase transition of the heat storage material, for example, by changing a driving mode of the cooling element in accordance with a phase transition timing of the heat storage material.

In addition, an imaging device according to the present technology includes a solid state imaging element and a signal processing unit that processes a captured image signal obtained by the solid state imaging element, in which the solid state imaging element includes a substrate portion on which a semiconductor chip having a plurality of light receiving elements arranged two-dimensionally is mounted and in which an external connection terminal for performing electrical connection to the outside is formed on a rear surface on a side opposite to a front surface which is a surface on a side where the semiconductor chip is mounted, an outer wall portion that protrudes toward the front surface side in an outer circumferential portion of the substrate portion, a lid portion which is supported by the outer wall portion and covers the semiconductor chip, and a heat storage member which is disposed at a position further inside than the outer wall portion between the rear surface of the substrate portion and a rear surface of the lid portion.

Thereby, it is possible to realize the imaging device on which the solid state imaging element capable of obtaining the same operations and effects as those of the above-described semiconductor device according to the present technology is mounted.

In addition, a method of manufacturing a semiconductor device according to the present technology is a method of manufacturing a semiconductor device that includes a substrate portion on which a semiconductor chip is mounted and in which an external connection terminal for performing electrical connection to an outside is formed on a rear surface on a side opposite to a front surface which is a surface on a side where the semiconductor chip is mounted, an outer wall portion that protrudes toward the front surface side in an outer circumferential portion of the substrate portion, and a lid portion which is supported by the outer wall portion and covers the semiconductor chip, the method including forming a heat storage member at a position further inside than the outer wall portion between the rear surface of the substrate portion and a rear surface of the lid portion.

The above-described semiconductor device according to the present technology can be manufactured by such a manufacturing method.

BRIEF DESCRIPTION OF DRAWINGS

FIGS. 1A and 1B are diagrams showing a schematic structure of a semiconductor device of a first example according to a first embodiment.
FIG. 2 is a diagram showing the reason why the shape of an inner wall portion in the first example is adopted.
[FIGS. 3A, 3B, 3C, 3D, and 3E]
FIGS. 3A, 3B, 3C, 3D, and 3E are diagrams showing an example of a creating process for the semiconductor device of the first example according to the first embodiment.
FIGS. 4A and 4B are diagrams showing a schematic structure of a semiconductor device of a second example according to the first embodiment.

[FIGS. 5A, 5B, 5O, 5D, 5E, and 5F]

FIGS. 5A, 5B, 5O, 5D, 5E, and 5F are diagrams showing an example of a creating process for the semiconductor device of the second example according to the first embodiment.

FIGS. 6A and 6B are diagrams showing a schematic structure of a semiconductor device of a third example according to the first embodiment.

[FIGS. 7A, 7B, 7O, 7D, and 7E]

FIGS. 7A, 7B, 7O, 7D, and 7E are diagrams showing an example of a creating process for the semiconductor device of the third example according to the first embodiment.

FIG. 8 is a schematic cross-sectional view of a semiconductor device of a first example according to a second embodiment.

FIG. 9 is a schematic cross-sectional view of a semiconductor device of a second example according to the second embodiment.

FIG. 10 is a schematic cross-sectional view of a semiconductor device of a third example according to the second embodiment.

FIG. 11 is a schematic cross-sectional view of a semiconductor device of a fourth example according to the second embodiment.

FIGS. 12A, 12B, 12C, and 12D are diagrams showing an example of a creating process for the semiconductor device of the first example according to the second embodiment.

FIG. 13 is a diagram showing a modification example for a method of closing an injection port for a heat storage material.

FIG. 14 is a diagram showing an example of formation of a heat storage member in a substrate portion in the second embodiment.

FIG. 15 is a diagram showing an example of formation of a heat storage member in the substrate portion in the second embodiment.

FIG. 16 is a diagram showing an example of formation of the heat storage member in the substrate portion in the second embodiment.

FIG. 17 is a diagram showing an example of formation of the heat storage member in the substrate portion in the second embodiment.

FIG. 18 is a diagram showing a modification example for the number of injection ports in the second embodiment.

FIG. 19 is a diagram showing an example in which a heat storage member is formed to be divided into a plurality of layers.

FIG. 20 is a schematic cross-sectional view of a semiconductor device of a first example according to a third embodiment.

FIG. 21 is a schematic cross-sectional view of a semiconductor device of a second example according to the third embodiment.

FIGS. 22A, 22B, 22C, 22D, 22E, and 22F show an example of a creating process for the semiconductor device of the third embodiment.

FIG. 23 is a diagram showing an example of an insulation countermeasure in the third embodiment.

FIG. 24 is a schematic cross-sectional view of a semiconductor device of a fourth embodiment.

FIG. 25 is a diagram showing an example of a creating process for the semiconductor device of the fourth embodiment.

FIG. 26 is a diagram showing an example of a creating process for the semiconductor device of the fourth embodiment.

FIG. 27 is a diagram showing an example of a creating process for the semiconductor device of the fourth embodiment.

FIG. 28 is a diagram showing an example of a creating process for the semiconductor device of the fourth embodiment.

FIG. 29 is a diagram showing an example of a creating process for the semiconductor device of the fourth embodiment.

FIG. 30 is a block diagram showing a configuration example of an imaging device to which a semiconductor device of an embodiment is applied.

FIG. 31 is a block diagram showing a configuration example of an imaging device for performing temperature management corresponding to phase transition detection results for a heat storage material.

FIG. 32 is a diagram showing configurations of main components extracted for temperature management in the imaging device shown in FIG. 31.

FIG. 33 is a flowchart showing an example of processing to be executed for temperature management.

Hereinafter, embodiments according to the present technology will be described in the following order with reference to the accompanying drawings.

<1. First embodiment>
[1-1. First example]
[1-2. Second example]
[1-3. Third example]
<2. Second embodiment>
<3. Third embodiment>
<4. Fourth embodiment>
<5. Imaging device>
<6. Example of temperature management using cooling element>
<7. Summary of embodiments and modification example>
<8. Present technology>

A semiconductor device used as a solid state imaging element (image sensor) such as a charge coupled device (CCD) sensor or a complementary metal oxide semiconductor (CMOS) sensor will be described below as an example of a semiconductor device of an embodiment according to the present technology. Further, the term "semiconductor package" is used in the following description, but the semiconductor package in this specification is a packaging member that packages a semiconductor element or an integrated circuit (IC) to protect it from the surroundings and provides a contact point (terminal or wiring) for inputting and outputting power or an electrical signal to and from the outside.

1. FIRST EMBODIMENT

[1-1. First example]

First, a semiconductor device 1 of a first example according to a first embodiment will be described with reference to FIGS. 1A, 1B, 2, 3A, 3B, 3C, 3D, and 3E.

Figure 1A:
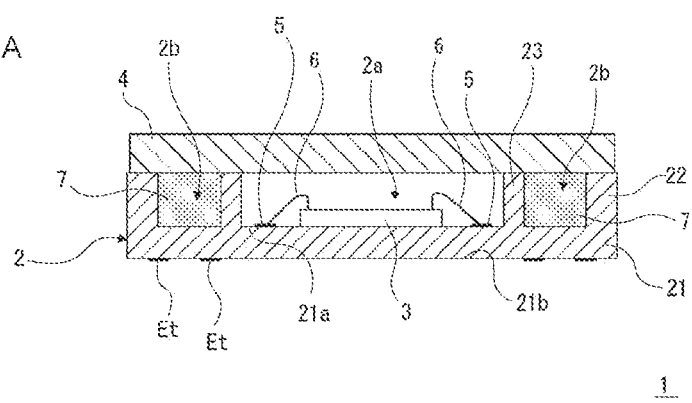
[FIGS. 1A and 1B]
Figure 1B:
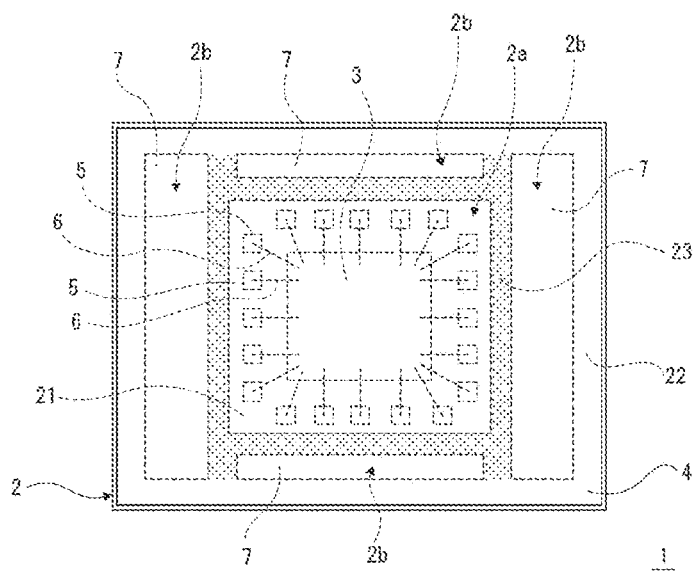

FIGS. 1A and 1B are diagrams showing a schematic structure of the semiconductor device 1 of the first example, FIG. 1A is a schematic cross-sectional view of the semiconductor device 1, and FIG. 1B is a top view of the semiconductor device 1.

The semiconductor device 1 is configured to include a semiconductor package 2 formed in a substantially concave shape when viewed in a cross-section, a semiconductor chip 3 mounted on a concave portion 2a of the semiconductor package 2, and a plate-shaped lid portion 4 for sealing the semiconductor chip 3.

The semiconductor chip 3 is configured as a light-receiving semiconductor chip for obtaining a captured image in the present example, and a plurality of light receiving elements performing photoelectric conversion are arranged two-dimensionally. The semiconductor chip 3 is also provided with a circuit portion that performs correlated double sampling (CDS), signal amplification, analog/digital (A/D) conversion, and the like on a pixel signal based on signal charge generated in accordance with the amount of light received in the light receiving elements.

A transparent substrate such as glass is used as the lid portion 4 in the present example.

The semiconductor device 1 protects the semiconductor chip 3 from external environmental factors such as water, humidity, or an external force, and thus the inside of the package is sealed by the lid portion 4. Specifically, in the present example, the concave portion 2a having the semiconductor chip 3 mounted thereon is filled with dry air or nitrogen and sealed or is vacuum-sealed.

The semiconductor package 2 includes a substrate portion 21 having the semiconductor chip 3 mounted thereon and an outer wall portion 22 protruding from an outer circumferential portion of the substrate portion 21. The outer wall portion 22 protrudes to the side of a front surface 21a which is a surface on a side where the semiconductor chip 3 is mounted on the substrate portion 21, and is positioned to cover the vicinity of the semiconductor chip 3.

The substrate portion 21 is configured such that a plurality of wiring layers having electric wires, vias, and the like formed therein are formed (see FIG. 8 and the like to be described later), and a plurality of external connection terminals Et for performing electrical connection to the outside of the semiconductor device 1 are formed in a rear surface 21b on a side opposite to the front surface 21a. In addition, a plurality of terminals 5 for electrical connection of the semiconductor chip 3 are formed on the front surface 21a of the substrate portion 21.

The semiconductor chip 3 is configured such that a predetermined terminal is electrically connected to the corresponding terminal 5 among the terminals 5 using a bonding wire 6 in a state where the semiconductor chip 3 is die-bonded to a predetermined position (the center in the present example) on the front surface 21a.

In the present example, the substrate portion 21 and the outer wall portion 22 are formed of a ceramic.

Here, in the semiconductor package 2, an inner wall portion 23 is formed on the inner side of the outer wall portion 22. Specifically, the inner wall portion 23 is a wall portion that protrudes from the substrate portion 21 to a side in the same direction as a direction in which the outer wall portion 22 protrudes on the inner side of the outer wall portion 22.

In the semiconductor package 2, a space is formed as a concave portion 2b between the inner wall portion 23 and the outer wall portion 22. In the semiconductor device 1, the concave portion 2b is filled with a heat storage material, and a portion filled with the heat storage material is formed as a heat storage member 7.

In the present example, the inner wall portion 23 is formed of a ceramic similar to the substrate portion 21 and the outer wall portion 22, and is formed integrally with the substrate portion 21 similar to the outer wall portion 22. In this case, the inner wall portion 23 has substantially a ladder shape when viewed from above (see a spotted portion in the drawing) as shown in FIG. 1B, and a plurality of concave portions 2b (four concave portions 2b in the present example) are positioned between the outer wall portion 22 and the inner wall portion 23. The heat storage member 7 is formed in each of the concave portions 2b, and the heat storage member 7 formed in each of the concave portions 2b in this manner is sealed by the lid portion 4 supported by the outer wall portion 22.

In the present example, a heat storage material that undergoes a phase transition in accordance with temperature (hereinafter referred to as a "phase transition type heat storage material") is used as the heat storage material constituting the heat storage member 7. Specifically, for example, the following two types of modes can be adopted. The first mode is a mode in which a thermosetting resin (for example, epoxy or acrylic) containing microcapsules containing a latent heat storage material such as paraffin or inorganic hydrated salt, and a resin containing granular materials such as vanadium oxide and a tin alloy are used as the heat storage member 7.

In addition, the second mode can be a mode in which a latent heat storage material such as paraffin or an inorganic hydrated salt is used as it is without being included in microcapsules.

In a case where the second mode mentioned above is adopted as the mode of the heat storage member 7 by the concave portion 2b being sealed by the lid portion 4 as described above, it is possible to prevent a liquefied heat storage material from flowing out of the concave portion 2b, specifically even when a heat storage material undergoing a phase transition from solid to liquid due to a rise in temperature is used. In the second mode mentioned above, heat can be directly transferred to a heat storage material as compared to the first mode, and thus heat radiation efficiency can be improved.

Figure 2:
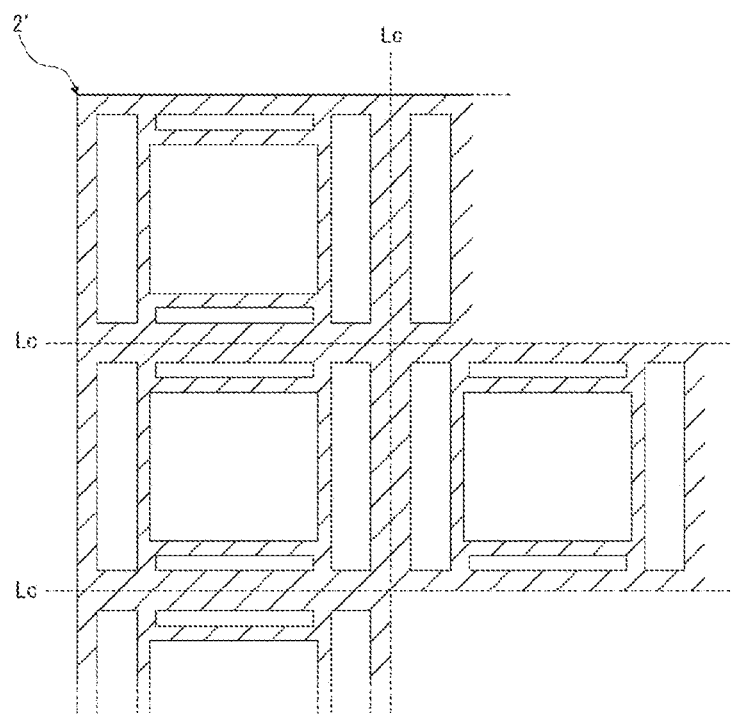
[FIG. 2]

Here, the inner wall portion 23 being formed to have substantially a ladder shape in the present example is based on the assumption that a package base material 2' as shown in FIG. 2 is divided into individual portions serving as the respective semiconductor packages 2. Specifically, the semiconductor package 2 formed of a ceramic is created by laminating and baking ceramic green sheets. However, at this time, in order to form a green sheet used to create the package base material 2' as one continuous sheet, a constituent portion of the outer wall portion 22 and a constituent portion of the inner wall portion 23 on the sheet need to be connected to each other. As a result, the inner wall portion 23 has a portion connected to the outer wall portion 22 and has substantially a ladder shape as shown in FIG. 1B in the present example.

Meanwhile, when the concave portion 2a on the inner side having the semiconductor chip 3 mounted thereon is configured as an inner cavity, the concave portion 2b formed on the outer side can be referred to as an outer cavity.

Next, an example of a creating process for the semiconductor device 1 will be described with reference to FIGS. 3A, 3B, 3C, 3D, and 3E.

First, the semiconductor package 2 is prepared as a laminated ceramic package (see FIG. 3A). As shown in the drawing, in the semiconductor package 2, the plurality of terminals 5 mentioned above are formed on the front surface 21a of the substrate portion 21, and a plurality of external connection terminals Et are formed on the rear surface 21b. Further, in the semiconductor package 2, the concave portion 2a is formed as an inner cavity on the inner side of the inner wall portion 23, and the plurality of concave portions 2b are formed between the outer wall portion 22 and the inner wall portion 23.

The semiconductor package 2 is created by performing screen printing of a metal paste on a sheet of such as alumina (aluminum oxide) to form a circuit pattern and laminating, pressing, and baking upper and lower layers connected through a via, and it is possible to freely perform wiring inside the package.

The semiconductor chip 3 is die-bonded within the concave portion 2a in the semiconductor package 2, and the terminals in the semiconductor chip 3 are electrically connected to the corresponding terminals 5 through bonding wires 6 (see FIG. 3B). Meanwhile, it is preferable that an adhesive used for die bonding be applied throughout a wide area with a high thermal conductivity.

In addition, the concave portions 2b are filled with a heat storage material formed of, for example, paraffin or the like to form the heat storage member 7 (see FIG. 3C), an adhesive ad is applied to the front surfaces of the outer wall portion 22 and the inner wall portion 23 (FIG. 3D), and the lid portion 4 is adhered using the adhesive ad (see FIG. 3E), thereby sealing the concave portion 2a and the heat storage member 7 in the concave portions 2b using the lid portion 4. At this time, it is assumed that the adhesive ad is continuously applied to the inner wall portion 23, and an inner cavity of the concave portion 2a and an outer cavity of the concave portion 2b are completely separated.

The semiconductor device 1 created as described above is accommodated in a housing of a target device in a state where the semiconductor device 1 is mounted on a substrate. Then, when the semiconductor device 1 is electrified and starts to operate, the semiconductor chip 3 generates heat, which leads to a rise in the temperature of the semiconductor chip 3. However, heat generated from the semiconductor chip 3 is transferred to the heat storage member 7 through the substrate portion 21 formed of a ceramic, and thus heat is rapidly discharged in spite of a rise in the temperature of the semiconductor chip 3, thereby suppressing a rapid rise in the temperature of the semiconductor chip 3.

[1-2. Second example]

Next, a semiconductor device 1A of a second example of the first embodiment will be described with reference to FIGS. 4A, 4B, 5A, 5B, 5C, 5D, 5E, and 5F.

Figure 4A:
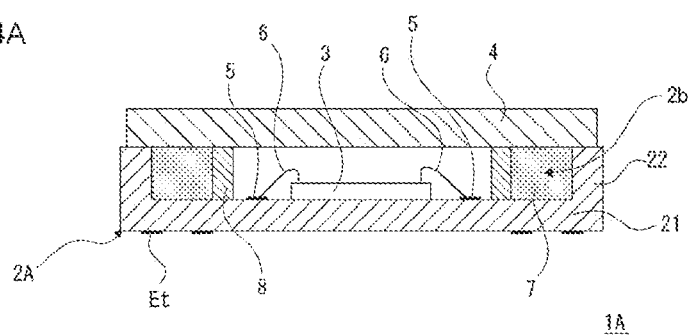
[FIGS. 4A and 4B]
Figure 4B:
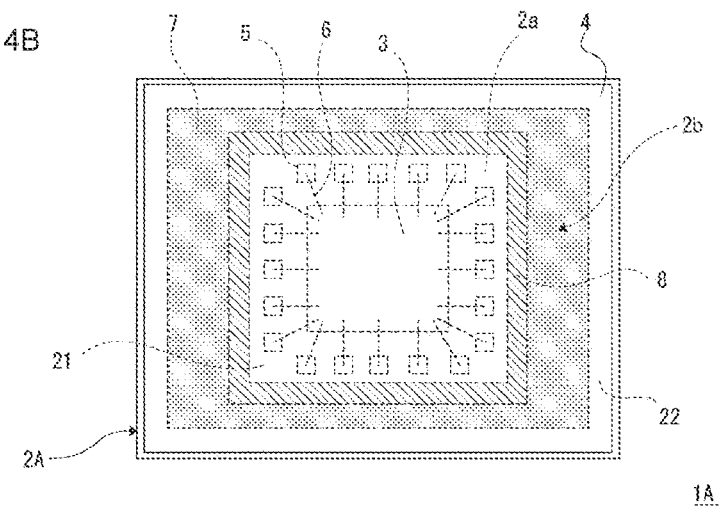

FIGS. 4A, and 4B are diagrams showing a schematic structure of the semiconductor device 1A of the second example, FIG. 4A is a schematic cross-sectional view of the semiconductor device 1A, and FIG. 4B is a top view of the semiconductor device 1A.

Meanwhile, in the following description, portions similar to those that have already been described above will be denoted by the same reference numerals and signs, and description thereof will be omitted.

In the semiconductor device 1A, a semiconductor package 2A is used instead of the semiconductor package 2. The semiconductor package 2A is different from the semiconductor package 2 in that an inner wall portion 23 is not formed.

In the semiconductor device 1A, a frame member 8 is disposed on the inner side of an outer wall portion 22 in the semiconductor package 2A. The frame member 8 surrounds a semiconductor chip 3 from the outside of a portion where a terminal 5 is formed in the substrate portion 21, and a concave portion 2a in this case serves as a space on the inner side of the frame member 8. In the present example, the shape of the frame member 8 is a square cylindrical shape. In addition, a metal member formed of, for example, copper, aluminum, or the like is used as the frame member 8.

As shown in FIG. 4B, a connection portion for the outer wall portion 22, like that included in the inner wall portion 23, is not formed in the frame member 8, and one continuous concave portion 2b is formed in the vicinity of the frame member 8 between the frame member 8 and the outer wall portion 22. The heat storage member 7 is formed in the concave portion 2b.

FIGS. 5A, 5B, 5C, 5D, 5E, and 5F are diagrams showing an example of a creating process for the semiconductor device 1A.

In this case, the semiconductor package 2A is prepared as a laminated ceramic package (see FIG. 5A), and the frame member 8 is adhered onto the substrate portion 21 in the semiconductor package 2A (see FIG. 5B). At this time, the frame member 8 is disposed to surround a portion where the terminal 5 is formed from the outside.

Then, the semiconductor chip 3 is die-bonded in the concave portion 2a on the inner side of the frame member 8, and the terminals in the semiconductor chip 3 are electrically connected to the corresponding terminals 5 using bonding wires 6 (see FIG. 5C). Meanwhile, an adhesion process for the frame member 8 and a die-bonding process for the semiconductor chip 3 may be performed before and after.

Further, the concave portion 2b is filled with a heat storage material formed of, for example, paraffin or the like to form the heat storage member 7 (see FIG. 5D), an adhesive ad is applied to the front surfaces of the outer wall portion 22 and the frame member 8 (FIG. 5E), and a lid portion 4 is adhered using the adhesive ad (see FIG. 5F), thereby sealing the concave portion 2a and the heat storage member 7 in the concave portion 2b with the lid portion 4.

A space (concave portion 2b) formed between the outer wall portion 22 and the inner wall portion on the inner side thereof is not required to be divided into a plurality of portions as in the first example by using the above-described frame member 8, and thus it is possible to increase the capacity of the heat storage member 7 and improve heat radiation efficiency. In addition, by using the frame member 8 formed of a metal, the degree of freedom in the shape of the inner wall portion is improved as compared to a case where the inner wall portion 23 formed of a ceramic is formed, and also in this respect, it is easy to achieve an increase in the capacity of the heat storage material 7 and there is an advantage in improving heat radiation efficiency.

[1-3. Third example]

Figure 6A:
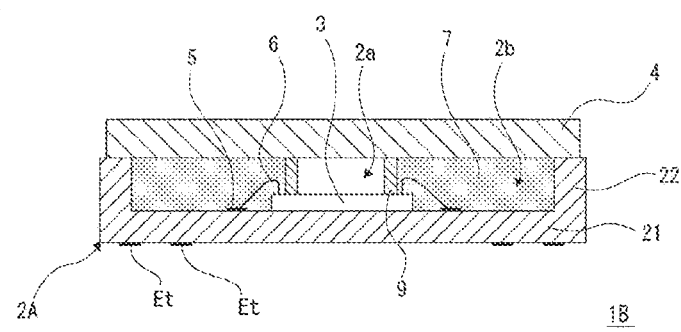
[FIGS. 6A and 6B]
Figure 6B:
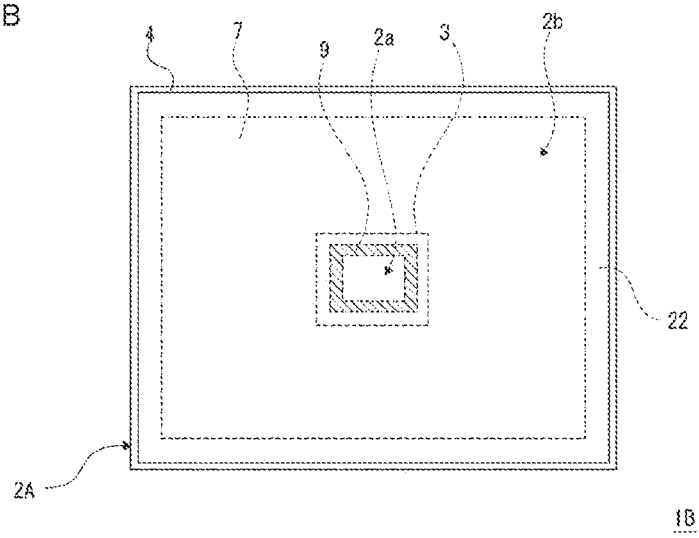

FIGS. 6A and 6B are diagrams showing a schematic structure of a semiconductor device 1B of a third example of the first embodiment, FIG. 6A is a schematic cross-sectional view of the semiconductor device 1B, and FIG. 6B is a top view of the semiconductor device 1B.

The semiconductor device 1B of the third example is contrived to increase the capacity of the heat storage member 7 as compared to the semiconductor device 1A, and is different from the semiconductor device 1A in that a frame member 9 is provided instead of the frame member 8.

The frame member 9 is, for example, a square cylindrical member provided on a semiconductor chip 3 as shown in the drawing. Since the frame member 9 is in contact with the semiconductor chip 3, a frame member formed of an insulating material such as a resin is used.

Similarly to the frame member 8, a connection portion for an outer wall portion 22, like that included in an inner wall portion 23, is not formed in the frame member 9, and one continuous concave portion 2b is formed in the vicinity of the frame member 9 between the frame member 9 and the outer wall portion 22. The heat storage member 7 is formed in the concave portion 2b.

FIGS. 7A, 7B, 70, 7D, and 7E are diagrams showing an example of a creating process for the semiconductor device 1A.

Similarly to the case of the second example, the semiconductor package 2A is prepared as a laminated ceramic package in this case as well (see FIG. 7A), the semiconductor chip 3 is die-bonded to a predetermined position on a substrate portion 21, and terminals in the semiconductor chip 3 are electrically connected to corresponding terminals 5 using bonding wires 6 (see FIG. 7B). Then, in this case, the frame member 9 is bonded to the upper surface of the semiconductor chip 3 by, for example, adhesion or the like (FIG. 7C). At this time, the frame member 9 is disposed on the semiconductor chip 3 to surround the outer side of a pixel region 3a included in the semiconductor chip 3. Here, the pixel region 3a is a region in which a plurality of light receiving elements are arranged two-dimensionally in the semiconductor chip 3.

It is also possible to perform antireflection coating on the inner surface of the frame member 9 in consideration of the influence on the image quality of a captured image.

After the frame member 9 is bonded to the upper surface of the semiconductor chip 3 as described above, the concave portion 2b formed on the outer side of the frame member 9 is filled with a heat storage material formed of, for example, paraffin or the like to form the heat storage member 7 (see FIG. 7D), and the lid portion 4 is adhered to the outer wall portion 22 on the front surface of the frame member 9, thereby sealing the concave portion 2a and the heat storage member 7 in the concave portion 2b with the lid portion 4 (see FIG. 7E).

It is possible to dispose the heat storage material 7 from the inner surface of the outer wall portion 22 to an outer circumferential portion of the semiconductor chip 3 by the semiconductor device 1B using the above-described frame member 9. For this reason, it is possible to further increase the capacity of the heat storage member 7 and further improve heat radiation efficiency.

Meanwhile, in the third example, the frame member 9 is not necessarily formed of a resin, and the frame member 9 formed of a material having a good thermal conductivity, such as a metal, may be bonded to the upper surface of the semiconductor chip 3 using an insulating adhesive, or the frame member 9 having undergone resin coating may be bonded to the upper surface of the semiconductor chip 3.

Further, in addition to performing antireflection coating, the frame member 9 can also be formed of a material that reflects little light.

Here, by providing the frame member 9, it is also possible to prevent light reflected from the bonding wires 6 from being incident on the pixel region 3a and prevent deterioration of image quality caused by the reflected light.

2. SECOND EMBODIMENT

Subsequently, a second embodiment will be described. In the second embodiment, a heat storage member 7 is provided in a substrate portion on which a semiconductor chip 3 is mounted. Hereinafter, first to fourth examples will be described as a specific configuration example of a semiconductor device 1C according to the second embodiment.

FIGS. 8, 9, 10, and 11 are schematic cross-sectional views of a semiconductor device 1Ca as the first example in the second embodiment, a semiconductor device 1Cb as the second example, a semiconductor device 1Cc as the third example, and a semiconductor device 1Cd as the fourth example. Meanwhile, FIGS. 8 to 11 schematically show the states of a plurality of wiring layers having wirings 21w and vias 21v and formed in the substrate portion on which the semiconductor chip 3 is mounted, but the number of wiring layers is not limited to the example shown in the drawing.

Figure 8:
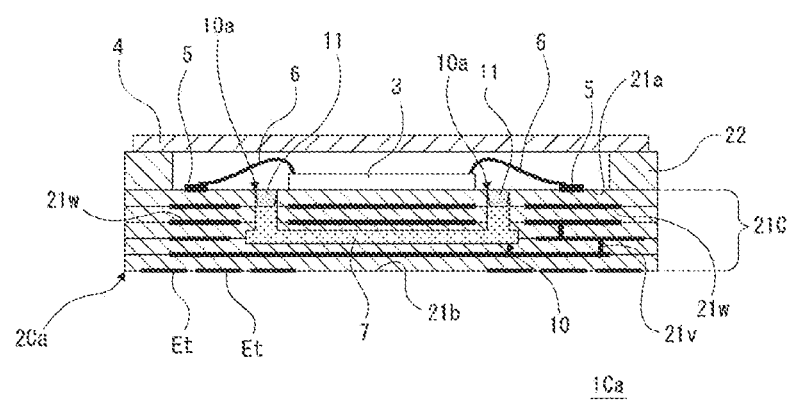
[FIG. 8]

In the semiconductor device 1Ca as the first example shown in FIG. 8, a semiconductor package in which a substrate portion 21C is formed instead of the substrate portion 21 is used as a concave-shaped semiconductor package 2Ca in which an outer wall portion 22 is formed. In the semiconductor package 2Ca, an inner wall portion (the inner wall portions based on the frame members 8 and 9 are also included) is not formed on the inner side of the outer wall portion 22, and a concave portion 2a having the semiconductor chip 3 mounted thereon is adjacent to the inner side of the outer wall portion 22.

A to-be-filled portion 10 filled with a heat storage material is formed in a predetermined wiring layer inside the substrate portion 21C. An injection port 10a for injecting a heat storage material into the to-be-filled portion 10 from the outside of the substrate portion 21C is formed in the to-be-filled portion 10. In the present example, the injection port 10a is formed at each of two locations so as to have an opening on the front surface 21a side of the substrate portion 21C. In the semiconductor device 1Ca, the to-be-filled portion 10 is filled with a heat storage material through the injection ports 10a, and the heat storage member 7 is formed in the to-be-filled portion 10. As shown in the drawing, the injection ports 10a are closed by corresponding plug members 11. In the present example, the plug member 11 has, for example, a cylindrical shape or a prismatic shape according to the shape of the injection port 10a, and at least a portion of the plug member 11 is inserted into the injection port 10a to close the injection port 10a.

Figure 9:
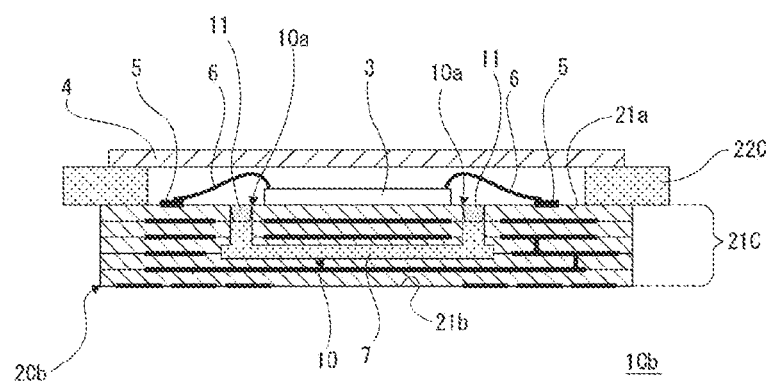
[FIG. 9]

The semiconductor device 1Cb as the second example shown in FIG. 9 is different from the semiconductor device 1Ca as the first example in that an outer wall portion 22C formed of a resin frame is formed instead of the outer wall portion 22 formed of ceramic. That is, in the semiconductor device 1Cb, a semiconductor package 2Cb in which the outer wall portion 22C constituted by a resin or metal frame in an outer circumferential portion of the substrate portion 21C is formed is used instead of the semiconductor package 2Ca in the semiconductor device 1Ca.

Figure 10:
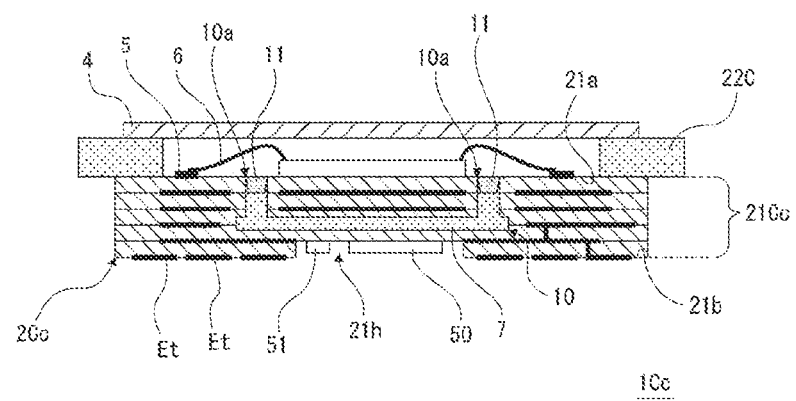
[FIG. 10]

The semiconductor device 1Cc as the third example shown in FIG. 10 is different from the semiconductor device 1Cb as the second example in that a semiconductor package 2Cc is used instead of the semiconductor package 2Cb.

The semiconductor package 2Cc is different from the semiconductor package 2Cb in the third example in that the substrate portion 21Cc is formed instead of the substrate portion 21C.

The substrate portion 21Cc is different from the substrate portion 21C in that a concave portion 21h recessed on the front surface 21a side is formed on the side of a rear surface 21b which is a surface on a side where an external connection terminal Et is formed. In the semiconductor device 1Cc, an electronic component 50 and an electronic component 51 other than the semiconductor chip 3 are mounted at a position which is the inside of the concave portion 21h on the rear surface 21b of the substrate portion 21Cc. Meanwhile, the "electronic component" mentioned herein broadly refers to a semiconductor chip other than the semiconductor chip 3, another semiconductor device having a package structure, an electronic component as a passive component for the semiconductor chip 3, or the like.

Figure 11:
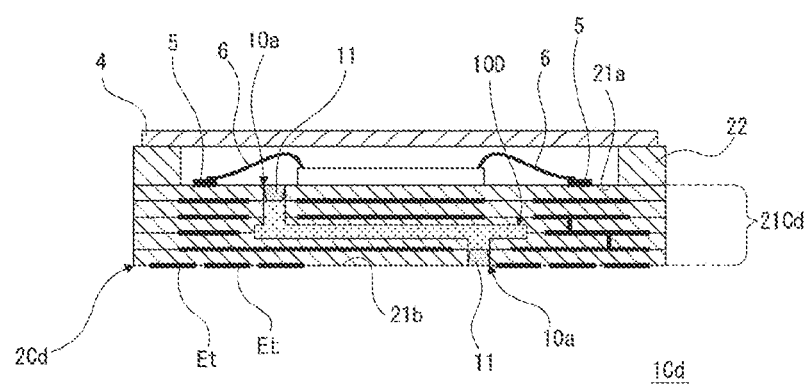
[FIG. 11]

The semiconductor device 1Cd as the fourth example shown in FIG. 11 is different from the semiconductor device 1Ca as the first example in that a substrate portion 21Cd is formed instead of the substrate portion 21C. That is, in the semiconductor device 1Cd, a semiconductor package 2Cd in which the substrate portion 21C is changed to the substrate portion 21Cd is used instead of the semiconductor package 2Ca in the semiconductor device 1Ca.

The substrate portion 21Cd is different from the substrate portion 21C in that the injection ports 10a are formed separately on both the front surface 21a side and the rear surface 21b side.

FIGS. 12A, 12B, 12C, and 12D are diagrams showing a creating process for the semiconductor device 1C according to the second embodiment. Here, as shown in the first to fourth examples mentioned above, a creating process corresponding to a case where a substrate portion formed of ceramic is used as a substrate portion on which the semiconductor chip 3 is mounted will be described, and a creating process for the semiconductor device 1Ca as the first example will be described as an example.

Figure 12A:
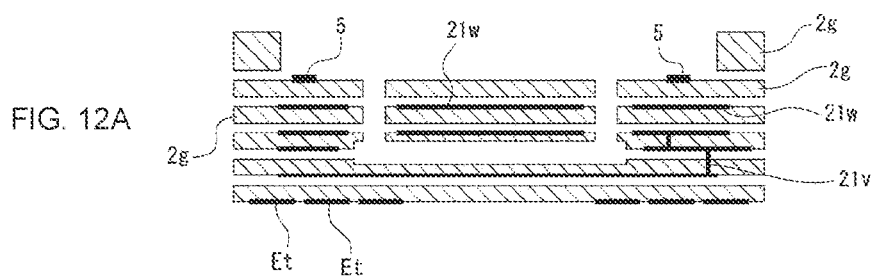
[FIGS. 12A, 12B, 12C, and 12D]

First, a green sheet 2g for forming the substrate portion 21C in which a notch portion for forming a terminal 5, an external terminal Et, the wiring 21w, the via 21v, and the injection port 10a, a notch portion for forming the to-be-filled portion 10, and the like are formed, and a green sheet 2g for forming the outer wall portion 22 are created and laminated on each other (see FIG. 12A).

Figure 12B:
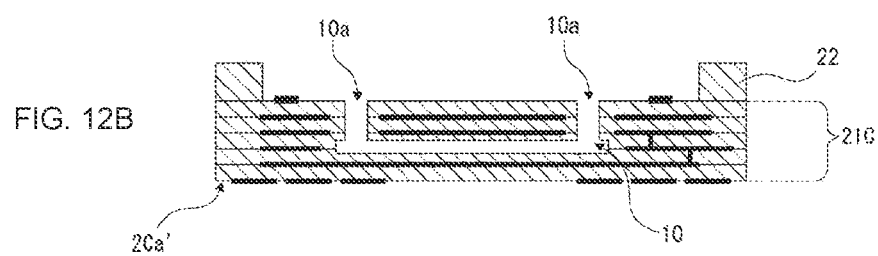

Then, a laminated body in which the green sheets 2g are laminated is backed, and other necessary processing such as plating is performed on the package, thereby creating a semiconductor package 2Ca' including the substrate portion 21C and the outer wall portion 22 (see FIG. 12B). In the semiconductor package 2Ca', the injection ports 10a and 10a and the to-be-filled portion 10 are formed on the substrate portion 21C.

Figure 12C:
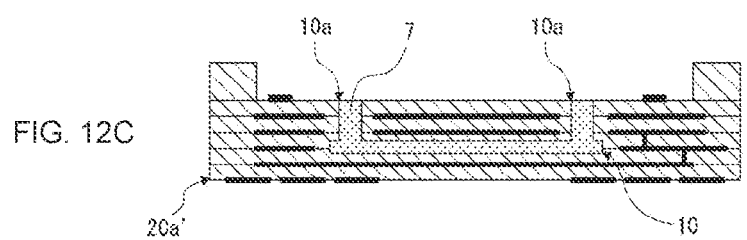

Then, the to-be-filled portion 10 of the semiconductor package 2Ca' is filled with a heat storage material through the injection ports 10a and 10a (see FIG. 12C). Here, a phase transition type heat storage material is used as a heat storage material. In this case, the to-be-filled portion 10 is filled with a heat storage material using a nozzle in a dispenser or the like from the injection ports 10a and 10a under an environment in which the heat storage material is in a liquid state. Meanwhile, in the case of powdered vanadium oxide showing a phase transition between solid phases, the to-be-filled portion 10 can also be filled with a heat storage material kneaded with, for example, wax, in addition to filling the space of the to-be-filled portion 10 with a heat storage material in a powder form from the injection ports 10a and 10a.

Figure 12D:
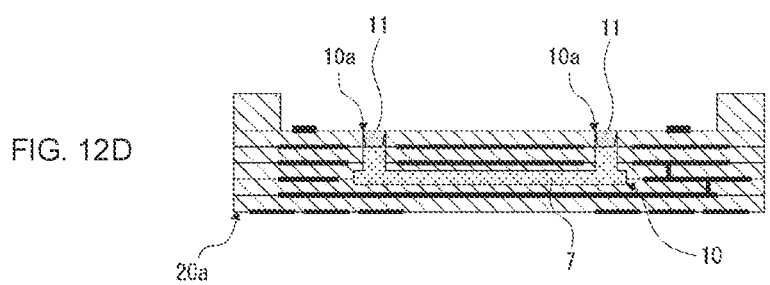

Further, after the heat storage material is filled as described above, the injection ports 10a and 10a are closed by the corresponding plug members 11 (see FIG. 12D). Specifically, in the present example, the injection ports 10a are closed by adhering the plug members 11 to the injection ports 10a.

Thereby, the semiconductor package 2Ca as shown in FIG. 8 is completed.

Meanwhile, in a case where the outer wall portion 22C is constituted by a resin or metal frame as shown in the second example (FIG. 9) and the third example (FIG. 10), a substrate portion formed of ceramic is created through a process similar to that in FIGS. 12A and 12B, and then a resin or metal frame is bonded to an outer circumferential portion of the substrate portion using an adhesive or the like.

Further, in the case of the third example, the frame is bonded to the outer circumferential portion of the substrate portion (21Cc) as described above, and then the electronic components 50 and 51 are mounted thereon.

Figure 13:
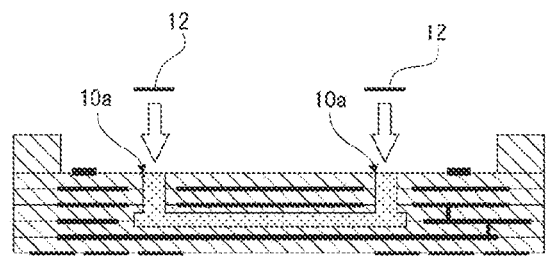
[FIG. 13]

Meanwhile, the injection ports 10a can also be closed by, for example, a tape member 12 as shown in FIG. 13. Examples of the material of the tape member 12 may include polyimide and the like.

Further, in a case where a plurality of injection ports 10a are formed, some of the injection ports 10a are not used to inject (fill) a heat storage material and can be made to function as a hole portion for bleeding air when the to-be-filled portion 10 is filled with a heat storage material.

An example of formation of the heat storage member 7 in the substrate portion will be described with reference to FIGS. 14 to 17. Meanwhile, hereinafter, the substrate portion 21C used in the first and second examples will be described as an example, but a similar formation example can also be applied to the third and fourth examples.

Figure 14:
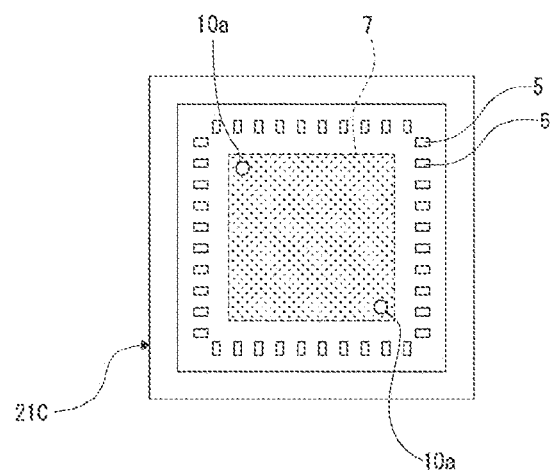
[FIG. 14]

FIG. 14 shows an example in which the heat storage member 7 is formed at one location in an in-plane direction of the substrate portion 21C. At this time, the shape or size of a formation portion for the heat storage member 7 in the in-plane direction of the substrate portion 21 may vary depending on an arrangement layout of the wirings 21w or the vias 21v.

Figure 15:
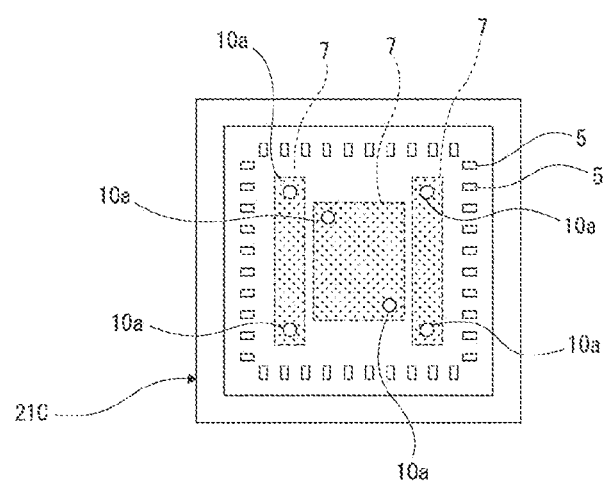
[FIG. 15]

FIG. 15 shows an example in which the heat storage members 7 are formed separately at a plurality of locations in an in-plane direction. Also in this case, the shape or size of each formed portion may vary depending on an arrangement layout of the wirings 21w or the vias 21v.

Figure 16:
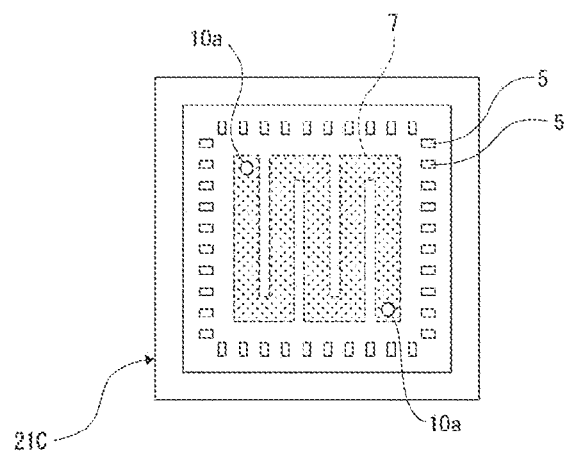
[FIG. 16]
Figure 17:
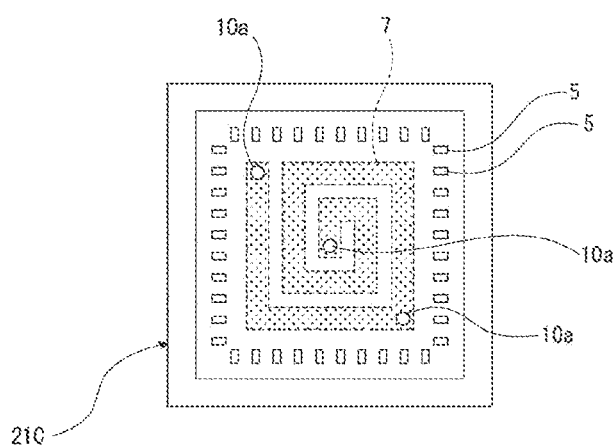
[FIG. 17]

FIG. 16 shows an example in which the heat storage member 7 is formed to have a meander shape (meandering shape), and FIG. 17 shows an example in which the heat storage member 7 is formed to have a spiral shape.

The widths or lengths of these formation portions for the heat storage members 7 having a meander shape or a spiral shape may vary depending on an arrangement layout of the wirings 21w or the vias 21v.

Figure 18:
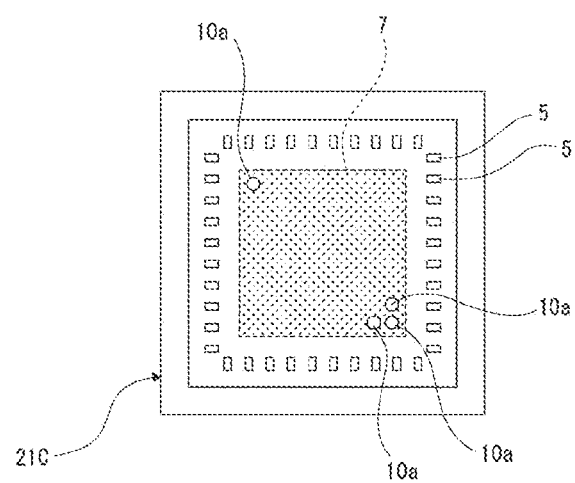
[FIG. 18]

FIG. 18 shows an example in which three or more injection ports 10a are provided at one location in a formation portion for the heat storage member 7.

It is possible to obtain an effect of easily bleeding air as described above and an effect of easily injecting a heat storage material by increasing the number of locations of the injection ports 10a.

Meanwhile, it is effective to dispose the injection port 10a at three or more locations even when a formation portion for the heat storage member 7 becomes longer by applying the example in FIG. 16 or FIG. 17.

Meanwhile, the examples in FIGS. 14 to 18 can be combined with each other.

Figure 19:
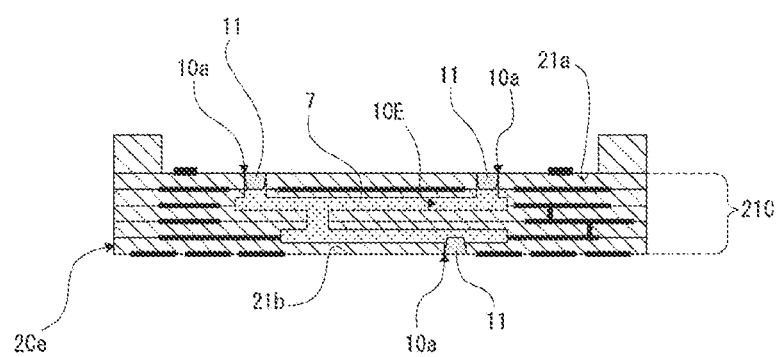
[FIG. 19]

FIG. 19 shows an example in which the heat storage members 7 are formed separately in a plurality of layers of a substrate portion.

In a semiconductor package 2Ce in this case, a to-be-filled portion 10E spanning a plurality of layers in the substrate portion 21C is formed. The to-be-filled portion 10E is filled with a heat storage material through the injection port 10a, and the injection port 10a is closed by the plug member 11.

Thereby, it is possible to prevent a portion restricted by a wiring layout from being biased to a single layer by disposing the heat storage member 7 in the substrate portion 21C, and it is possible to improve the degree of freedom of a wiring layout in the substrate portion 21C.

Meanwhile, an example in which the injection port 10a is closed by adhesion of the plug member 11 has been described above, but it is also possible to adopt a method of closing the injection port 10a by applying various thermosetting type, moisture-curing type, ultraviolet-curing type adhesives and fillers to the injection port 10a and then performing necessary hardening processing.

Further, in the second embodiment, the injection port 10a is not necessarily closed. For example, in a case where the heat storage member 7 is formed according to the above-described first mode, the possibility of the heat storage material flowing out due to a phase transition is low, and in this case, it is possible to make it unnecessary to close the injection port 10a.

3. THIRD EMBODIMENT

A semiconductor device 1D according to a third embodiment will be described with reference to FIGS. 20, 21, 22A, 22B, 22C, 22D, 22E, 22F, and 23.

Figure 20:
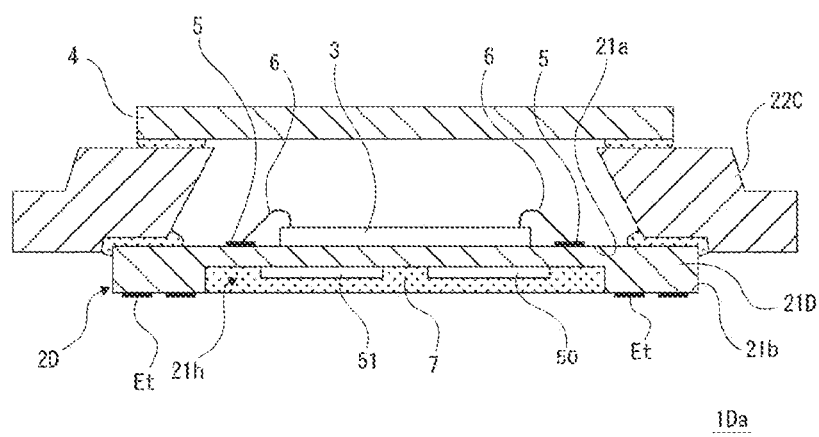
[FIG. 20]

FIG. 20 is a schematic cross-sectional view of a semiconductor device 1Da as a first example in the third embodiment.

The semiconductor device 1Da includes a semiconductor package 2D having a substrate portion 21D in which a concave portion 21h recessed on the front surface 21a side is formed on the side of a rear surface 21b which is a surface on a side where an external connection terminal Et is formed, similar to the substrate portion 21Cc in the semiconductor device 1Cc shown in FIG. 10. In the semiconductor package 2D, an outer wall portion 22C constituted by a resin or metal frame is formed, instead of an outer circumferential portion 23 formed of ceramic.

Similarly to the case of FIG. 10, an electronic component 50 and an electronic component 51 are mounted at a position within the concave portion 21h on the rear surface 21b of the substrate portion 21D.

Then, in the semiconductor device 1D, the electronic components 50 and 51 are covered with a heat storage member 7 within the concave portion 21h.

Figure 21:
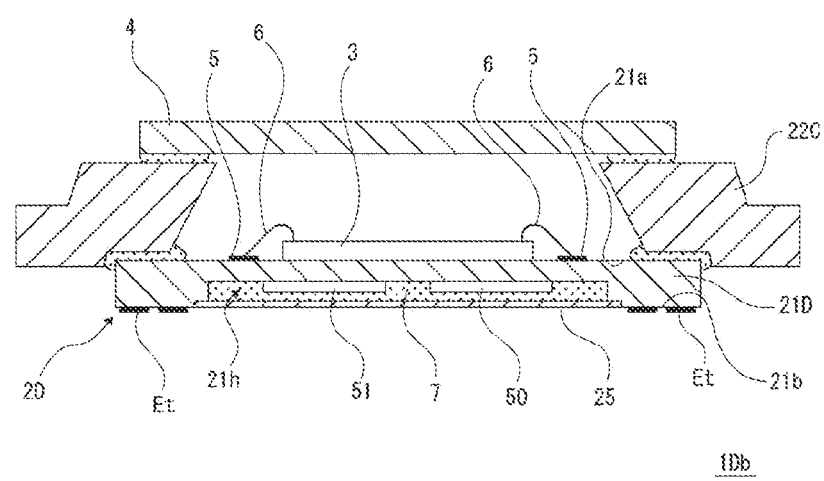
[FIG. 21]

Here, the configuration in FIG. 20 is a configuration corresponding to a case where the heat storage member 7 to which the above-described second mode is applied is used, and in a case where the first mode in which the flow-out of a heat storage material is concerned due to a phase transition to a liquid state is used, it is preferable to adopt a configuration of a semiconductor device 1Db as a second example shown in FIG. 21.

The semiconductor device 1Db shown in FIG. 21 is different from the semiconductor device 1Da in that a closing member 25 closing the concave portion 21h having the heat storage member 7 formed therein is provided. The closing member 25 is bonded to the rear surface 21b of the substrate portion 21D by, for example, adhesion to close the concave portion 21h.

Here, heat generated from both the front and rear surfaces of the substrate portion 21D is concentrated on the substrate portion 21D as an interposer substrate on which electronic components (a semiconductor chip 3 and the electronic components 50 and 51) serving as heat sources are mounted on both the front and rear surfaces thereof as shown in FIG. 20 or FIG. 21, and thus there is a concern that the generated heat cannot be sufficiently discharged.

For this reason, in the third embodiment, heat radiation efficiency is improved by forming the heat storage member 7 in the concave portion 21h on which the electronic components 50 and 51 are mounted as described above.

An example of a creating process for the semiconductor device 1D (1Da, 1Db) according to the third embodiment will be described with reference to FIGS. 22A, 22B, 22C, 22D, 22E, and 22F.

Figure 22A:
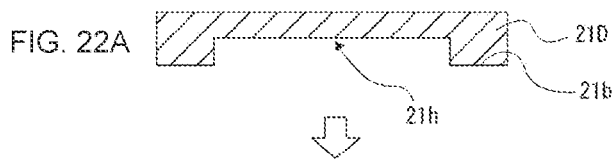
[FIGS. 22A, 22B, 22C, 22D, 22E, and 22F]
Figure 22B:
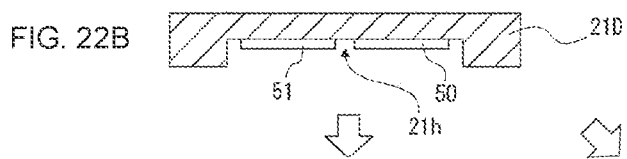
Figure 22C:
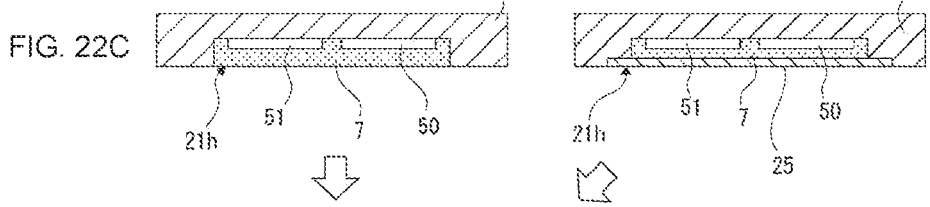

First, the substrate portion 21D having the concave portion 21h formed therein is prepared (FIG. 22A), and the electronic components 50 and 51 are mounted in the concave portion 21h (FIG. 22B). Thereafter, the concave portion 21h is filled with a heat storage material, and the heat storage member 7 is formed in the concave portion 21h (FIG. 22C). Here, in the case of the first example, the heat storage member 7 is formed by hardening a heat storage material-containing resin. On the other hand, in the case of the second example, after the concave portion 21h is filled with a heat storage material, the concave portion 21h filled with the heat storage material is closed by a closing member 25 as shown in FIG. 22D.

Figure 23:
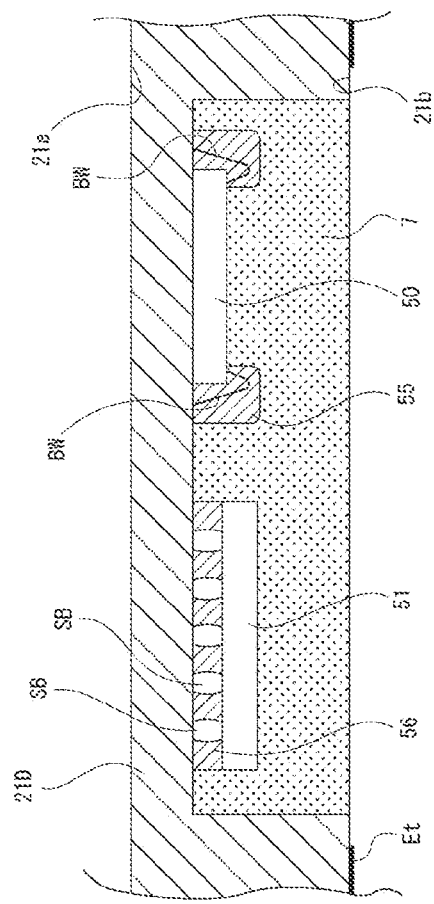
[FIG. 23]

Meanwhile, the electronic components 50 and 51 can be mounted on the substrate portion 21D using, for example, a bonding wire BW as shown in a schematic cross-sectional view of FIG. 23 or by a pin grid array (PGA) using a plurality of solder junction portions SB, but in both cases, it is preferable that an appropriate insulation countermeasure be performed on the heat storage member 7. For example, an insulation countermeasure can be performed by filling a bonding resin 55 in a case where a bonding wire BW as shown in the drawing is used, filling the solder junction portions SB in the PGA with an underfill material 56, or the like.

Figure 22D:
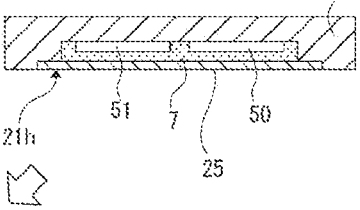
Figure 22E:
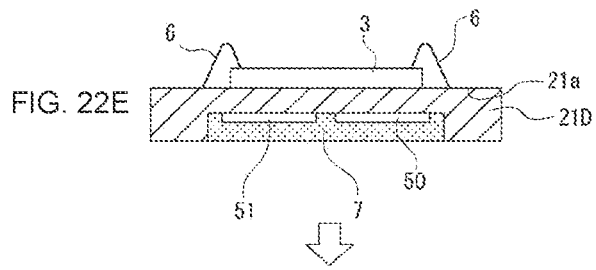
Figure 22F:
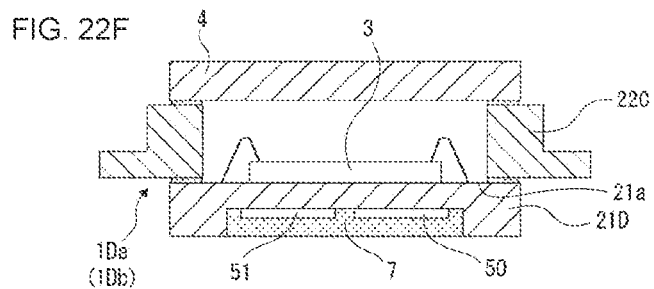

After the process in FIGS. 22C and 22D is performed, attachment of the semiconductor chip 3 to the front surface 21a side of the substrate portion 21D through die bonding or the like, and electrical connection processing using bonding wires 6 are performed similar to the process described in FIG. 3C and the like (FIG. 22E), and then, the formation of the outer wall portion 22C which is performed by bonding a frame to the outer circumferential portion of the substrate portion 21D, and sealing using a lid portion 4 are performed (FIG. 22F).

Meanwhile, in a case where a metal frame is used for the outer wall portion 22C, it is preferable to perform black plating to reduce flare due to reflection from the metal frame.

4. FOURTH EMBODIMENT

Figure 24:
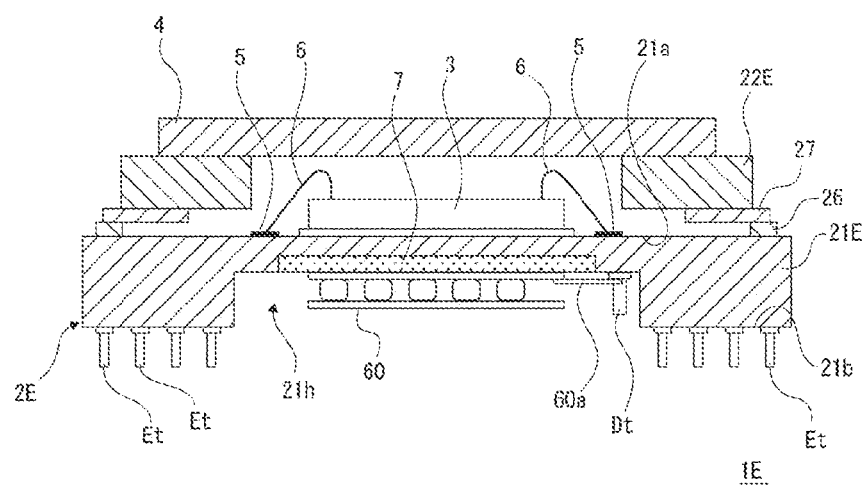
[FIG. 24]

FIG. 24 is a schematic cross-sectional view of a semiconductor device 1E according to a fourth embodiment.

In the semiconductor device 1E, a cooling element 60 is disposed at a position facing a semiconductor chip 3 on a rear surface 21b side of a substrate portion on which the semiconductor chip 3 is mounted.

The semiconductor device 1E includes a semiconductor package 2E having a substrate portion 21E.

Similarly to the substrate portion 21Cc shown in FIG. 10, the substrate portion 21E is a substrate portion schematically shown as a structure in which a heat storage member 7 is formed therein and a concave portion 21h is formed on the rear surface 21b side. The heat storage member 7 is formed at (a position overlapping) a position facing the semiconductor chip 3 in the substrate portion 21E.

A ceramic frame 22E is bonded to an outer circumferential portion on the front surface 21a side of the substrate portion 21E through a seal ring 26 and a metal 27. The ceramic frame 22E functions as an outer wall portion of the semiconductor device 1E which covers the semiconductor chip 3 mounted on the substrate portion 21D from the outside. The semiconductor chip 3 is sealed airtightly by a lid portion 4 adhered to the front surface side of the ceramic frame 22 by adhesion or the like. In the present example, a space on the inner side of the semiconductor device 1E sealed airtightly is filled with dry air or nitrogen or is vacuumized.

The cooling element 60 is bonded to a position facing the semiconductor chip 3 on the rear surface 21b of the substrate portion 21E by adhesion or the like.

In the present example, a Peltier module is used for the cooling element 60. The Peltier module has a structure in which a thermoelectric semiconductor is sandwiched between ceramic substrates and functions by being electrified through a lead wire 60a.

As shown in the drawing, a connection terminal Dt for the cooling element 60 is formed in the substrate portion 21E, and the lead wire 60a is electrically connected to the connection terminal Dt.

Here, as a solid state imaging element using the cooling element 60, there is a solid state imaging element adopting a configuration in which the cooling element 60 is built in a package inner space in which the semiconductor chip 3 is disposed. However, in a case where a configuration having the cooling element 60 built-in is adopted in this manner, there is a problem in that dust generated from the cooling element 60 is mixed into the package inner space, or it is difficult to control warpage and agitation of the semiconductor chip 3 because the semiconductor chip 3 is mounted on the cooling element 60 (through an interposer substrate).

In addition, there are a large number of adhesion interfaces in its structure, and there is also a problem in that a relatively high risk of reliability of a semiconductor package such as generation of outgas from an adhesive or peeling of the adhesion interfaces occurs, and it is very difficult to replace the cooling element 60 when it breaks down.

On the other hand, in the present embodiment, as shown in FIG. 24, a configuration in which the cooling element 60 is disposed at a position facing the semiconductor chip 3 on the rear surface 21b side of the substrate portion 21E having the semiconductor chip 3 mounted thereon is adopted.

Thereby, heat generated from the semiconductor chip 3 is efficiently transferred to the cooling element 60 through the substrate portion 21E, and thus it is possible to improve the efficiency of temperature control using the cooling element 60. In particular, it is possible to reduce power consumption required during cooling.

Further, in the semiconductor device 1E, the heat storage member 7 is built in the substrate portion 21E and is disposed between the cooling element 60 and the semiconductor chip 3, and thus heat is efficiently transferred from the semiconductor chip 3 to the cooling element 60 through the heat storage member 7. That is, it is possible to further improve the efficiency of temperature control using the cooling element 60.

In addition, unlike a case where the cooling element 60 is built in, it is possible to avoid a risk of deterioration in image quality due to dust generated from the cooling element 60.

Further, the semiconductor chip 3 may not be mounted on the cooling element 60, and thus the control of warpage and agitation of the semiconductor chip 3 is also facilitated. Further, it is possible to reduce the size of the adhesion interface, suppress generation of outgas from an adhesive, peeling of the adhesion interface, or the like, and reduce a risk of reliability of the semiconductor package.

In addition, it is possible to easily replace the cooling element 60 when it breaks down.

Further, in the semiconductor device 1E of the present example, a space on the inner side of the semiconductor device 1E sealed airtightly is filled with dry air or nitrogen or is vacuumized. Thereby, even when temperature control is performed by operating the cooling element 60, it is possible to make it difficult to cause condensation and it is possible to improve reliability.

An example of a creating process for the semiconductor device 1E according to the fourth embodiment will be described with reference to cross-sectional views of FIGS. 25 to 29.

Figure 25:
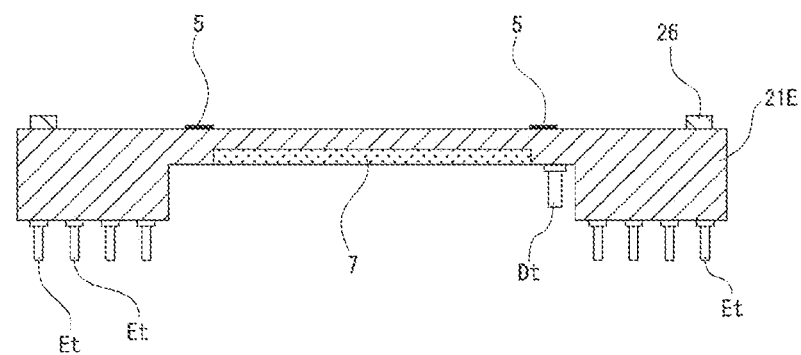
[FIG. 25]

First, the substrate portion 21E on which the seal ring 26 is formed as shown in FIG. 25 is prepared.

Figure 26:
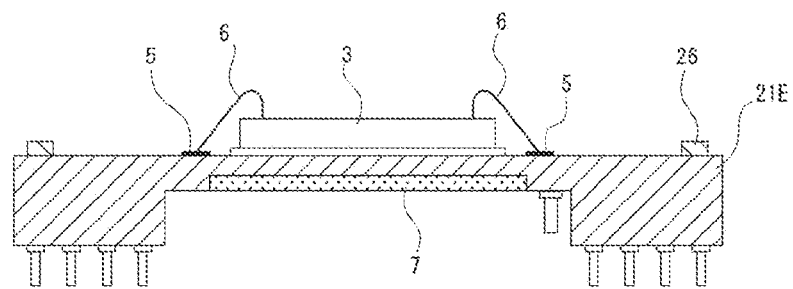
[FIG. 26]

Next, as shown in FIG. 26, the semiconductor chip 3 is mounted on the substrate portion 21E (a method of mounting the semiconductor chip 3 on the substrate portion is similar to the mounting method described so far, and thus repeated description will be avoided).

Figure 27:
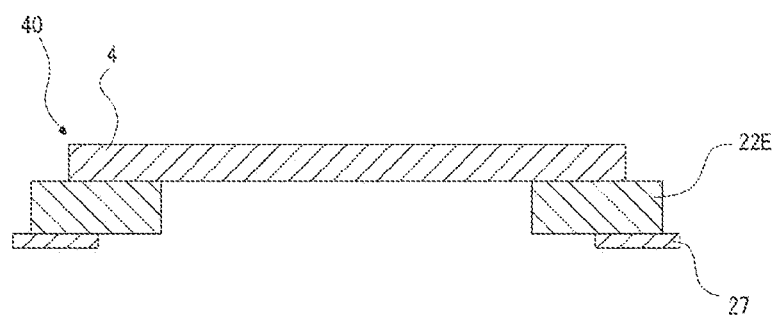
[FIG. 27]

On the other hand, a sealing member 40 shown in FIG. 27 is prepared. The sealing member 40 is constituted by the lid portion 4, the ceramic frame 22E, and the metal 27, the lid portion 4 and the ceramic frame 22E are bonded to each other using, for example, low melting point glass, and the ceramic frame 22E and the metal 27 are bonded to each other using, for example, an Ag—Cu brazing material or the like. The metal 27 is, for example, a Fe—Ni—Co alloy (so-called kovar), and surface processing is performed on the metal by plating using nickel (Ni), gold (Au), and the like.

Figure 28:
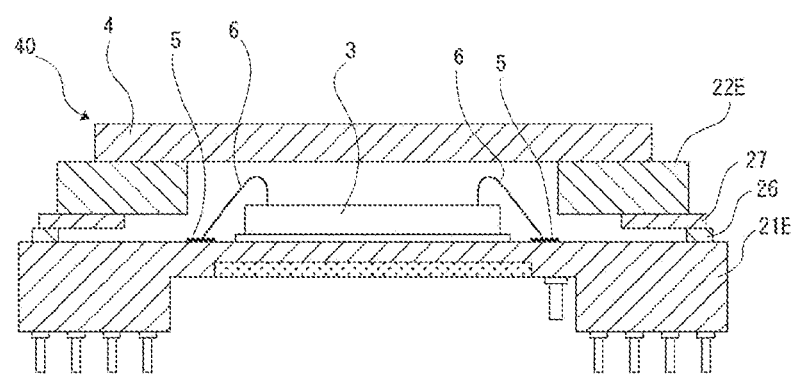
[FIG. 28]

The sealing member 40 is aligned with the substrate portion 21E in the state shown in FIG. 26, and then the semiconductor chip 3 is sealed airtightly by a bonding method such as seam welding (see FIG. 28).

Here, the seam welding, which is a type of resistance welding, is a method of rotating an electrode while pressing and electrifying the electrode using a roller electrode to perform continuous welding, and is performed to bond the seal ring 26 formed in the substrate portion 21E and the metal 27 in the sealing member 40 to each other. In this process, the inside of a chamber provided in a seam welding device is made into atmosphere of dry air, nitrogen, vacuum, or the like, so that the atmosphere inside the package can also be maintained in a state of dry air, nitrogen, vacuum, or the like.

Figure 29:
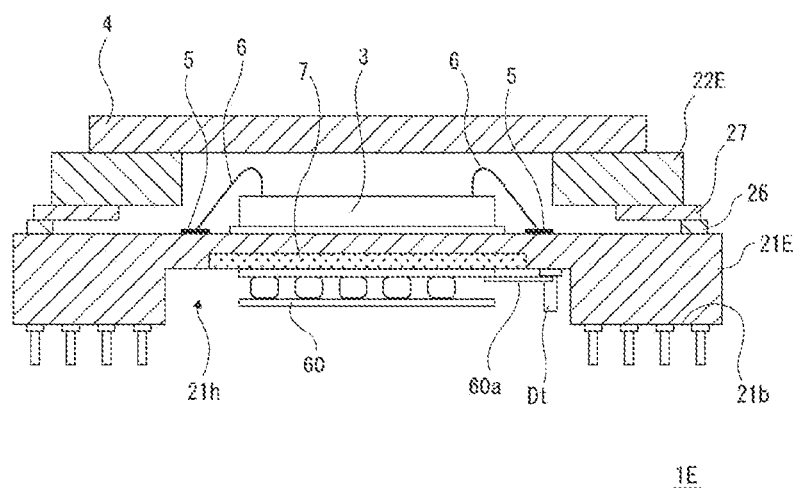
[FIG. 29]

Subsequently, as shown in FIG. 29, the cooling element 60 is mounted in the concave portion 21h of the substrate portion 21E. At this time, the cooling element 60 is mounted at a position facing the heat storage member 7 in the substrate portion 21E. The cooling element 60 is bonded to the substrate portion 21E by, for example, adhesion.

Then, electrical connection is secured by winding the lead wire 60a of the cooling element 60 around the connection terminal Dt formed in the substrate portion 21E and then performing soldering.

The semiconductor device 1E shown in FIG. 24 can be created by such a process.

Here, in a case where a phase transition type heat storage material is used as a heat storage material, a function as a heat storage material will be lost when a phase transition temperature is exceeded. However, temperature control of the cooling element 60 is performed such that the temperature of the heat storage material does not exceed a phase transition temperature at all times or the temperature of the heat storage material is set to be equal to or lower than the phase transition temperature even when the temperature of the heat storage material exceeds the phase transition temperature, and thus the effect of the heat storage material can be permanently exhibited.

Meanwhile, an example in which the substrate portion 21E having the heat storage member 7 built-in is used has been described above. However, for example, a configuration in which the heat storage member 7 is bonded to the rear surface 21b of the substrate portion having the semiconductor chip 3 mounted thereon by adhesion or the like, and the cooling element 60 is bonded onto the heat storage member 7 can also be adopted.

In the fourth embodiment, the heat storage member 7 is only required to be disposed between the cooling element 60 and the semiconductor chip 3.

5. IMAGING DEVICE

Figure 30:
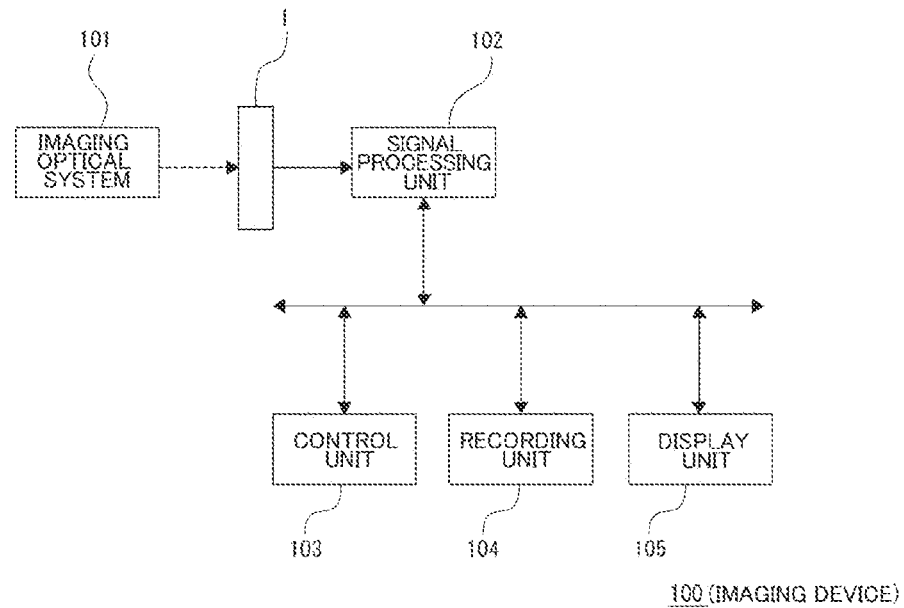
[FIG. 30]

FIG. 30 is a block diagram showing a configuration example of an imaging device 100 to which the semiconductor device according to the embodiment is applied. Meanwhile, in FIG. 30, an example in which the semiconductor device 1 is applied will be described, but of course, the semiconductor devices 1A, 1B, 1C (1Ca, 1Cb, 1Cc, 1Cd), 1D (1Da, 1Db), and 1E can also be applied.

As shown in the drawing, the imaging device 100 includes the semiconductor device 1, and also includes an imaging optical system 101, a signal processing unit 102, a control unit 103, a recording unit 104, and a display unit 105.

The imaging optical system 101 includes a predetermined number of lens groups for imaging including, for example, a zoom lens, a focus lens, an aperture, and the like, and condenses incident light on a light receiving surface of the semiconductor device 1 as an image sensor.

The semiconductor device 1 receives light incident through the imaging optical system 101, converts the received light into an electrical signal, and outputs the converted light. Specifically, the semiconductor device 1 executes, for example, correlated double sampling (CDS) processing, automatic gain control (AGC) processing, and the like on an electrical signal obtained by performing photoelectric conversion on received light, and further executes analog/digital (A/D) conversion processing thereon. Then, an image signal (captured image signal) as digital data is output to the signal processing unit 102 provided at a stage after the semiconductor device.

The signal processing unit 102 is configured as an image processing processor by, for example, a digital signal processor (DSP) or the like. The signal processing unit 102 performs various image signal processing on a digital signal (captured image signal) which is input from the semiconductor device 1 as an image sensor to generate moving image data or still image data corresponding to a captured image.

The control unit 103 is configured to include a microcomputer including, for example, a central processing unit (CPU), a read only memory (ROM), a random access memory (RAM), and the like, or including an information processing device such as a DSP, and performs the overall control of the imaging device 100 by executing, for example, processing according to a program stored in the ROM.

The recording unit 104 is constituted by, for example, a non-volatile memory, and stores an image file such as moving image data or still image data, a thumbnail image, and the like obtained by processing performed by the signal processing unit 102.

The actual form of the recording unit 104 can be considered in various manners. For example, the recording unit 104 may be a flash memory built in the imaging device 100, or may have a form based on a memory card attachable and detachable to and from the imaging device 100 (for example, a portable flash memory) and a card recording reproduction unit that performs recording reproduction access on the memory card. In addition, the recording unit may be realized as a hard disk drive (HDD) as a form built in the imaging device 100.

The display unit 105 is a display unit that performs various displays on an imaging person, and for example, is a liquid crystal display (LCD) disposed in a housing of the imaging device 100, a display panel of a display device such as an organic electro-luminescence (EL) display, or a viewfinder.

The display unit 105 executes various displays on a display screen in response to an instruction of the control unit 103. For example, the display unit 105 displays a reproduction image of image data read from a recording medium in the recording unit 104.

In addition, image data of a captured image of which the resolution is converted into a resolution for display by the signal processing unit 102 is supplied to the display unit 105, and the display unit 105 performs display based on the image data in response to an instruction of the control unit 103. Thereby, a so-called through image (a monitoring image of a subject) is displayed.

In addition, the display unit 105 executes display as a graphical user interface (GUI), such as various operation menus, an icon, and a message, on a screen in response to an instruction of the control unit 103.

6. EXAMPLE OF TEMPERATURE MANAGEMENT USING COOLING ELEMENT

Here, regarding a semiconductor device on which the cooling element 60 as exemplified in the fourth embodiment is mounted, it is possible to perform temperature management corresponding to a phase transition detection result of a heat storage material, instead of performing temperature management corresponding to a temperature detection result, as temperature management in a case where a phase transition type heat storage material is used as a heat storage material.

Figure 31:
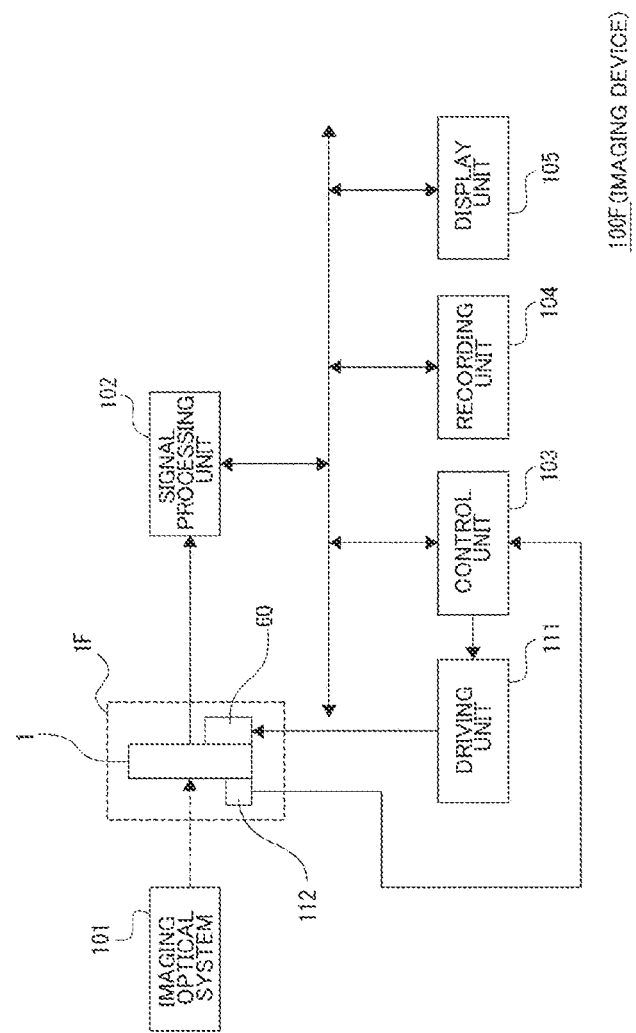
[FIG. 31]
Figure 32:
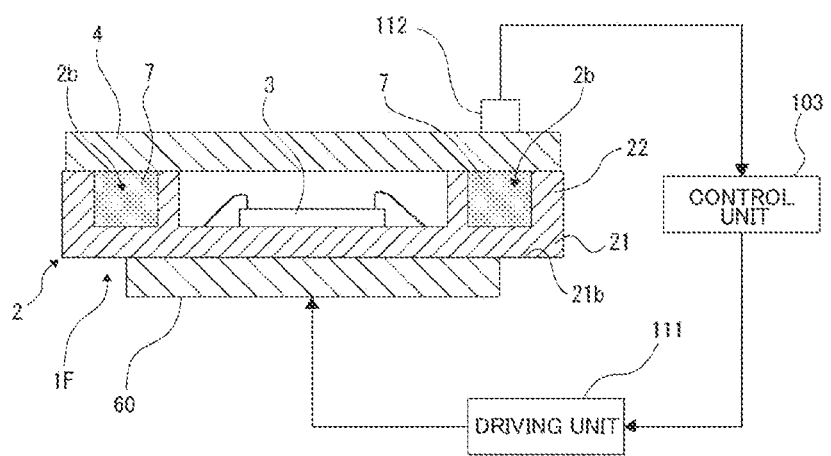
[FIG. 32]

FIG. 31 is a block diagram showing a configuration example of an imaging device 100F corresponding to a case where such temperature management is performed, and FIG. 32 is a diagram showing configurations of main components extracted for temperature management in the imaging device 100F.

In the imaging device 100F, a semiconductor device 1F is provided as a solid state imaging element. The semiconductor device 1F is configured such that, for example, a cooling element 60 and a phase transition detection unit 112 are provided in the semiconductor device 1 shown in FIGS. 1A and 1B (see FIG. 32). In this case, a heat storage member 7 is constituted by a heat storage material undergoing a phase transition from solid to liquid in association due to a rise in temperature.

The phase transition detection unit 112 detecting a phase transition of the heat storage member 7 is configured to include a light projection portion and a light receiving portion in the present example. The phase transition detection unit 112 in the present example is configured such that light is projected onto the heat storage member 7 by the light projection portion and such that light reflected from the heat storage member 7 accompanying the light projection is received by the light receiving portion.

Further, in the imaging device 100F, a driving unit 111 that drives the cooling element 60 in response to an instruction received from a control unit 103 is provided.

The control unit 103 in this case performs temperature management of the semiconductor device 1F by controlling the driving unit 111 on the basis of a detection result for a phase transition of the heat storage member 7 which is obtained by the phase transition detection unit 112.

Figure 33:
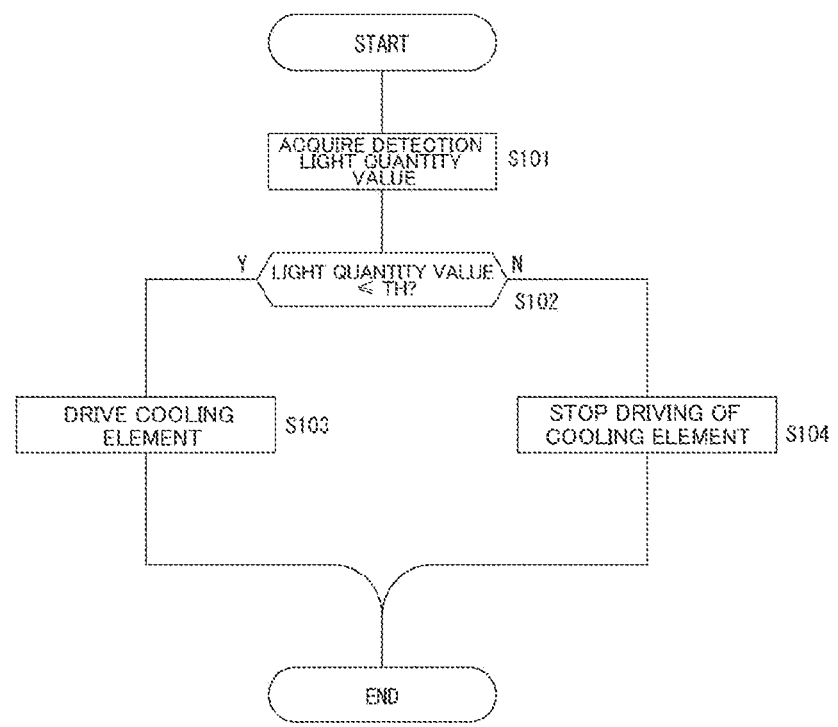
[FIG. 33]

FIG. 33 is a flowchart showing an example of processing to be executed by the control unit 103 for such temperature management. Meanwhile, the control unit 103 repeatedly executes the processing shown in the drawing, for example, with a predetermined cycle time.

First, the control unit 103 acquires a detection light quantity value by the light receiving portion of the phase transition detection unit 112 (step S101), and determines whether the detection light quantity value has decreased below a predetermined threshold value TH (step S102).

Here, in the present example, the phase transition detection unit 112 irradiates the heat storage member 7 with light and detects the amount of reflected light. At this time, a heat storage material in the heat storage member 7 starts to change from solid to liquid and the amount of liquid in the heat storage member 7 is increased, the amount of reflection of light emitted to the heat storage material changes, and it is possible to ascertain a phase transition state of the heat storage material. Specifically, the amount of reflected light decreases gradually in association with an increase of the amount of liquid.

Thus, by determining whether or not the detection light quantity value has decreased below the threshold value TH as described above, it is possible to determine whether or not a phase transition of the heat storage material from solid to liquid has progressed by a certain amount or more.

In a case where the detection light quantity value has decreased below the threshold value TH, the control unit 103 instructs the driving unit 111 to drive the cooling element 60 (step S103). On the other hand, in a case where the detection light quantity value has not decreased below the threshold value TH, the control unit 103 instructs the driving unit 111 to stop driving the cooling element 60 (step S104).

Thereby, the amount of liquid in the heat storage material exceeds a certain amount even when temperature does not change, that is, a phase transition from solid to liquid progresses to a certain degree, and it is possible to perform heat radiation by driving the cooling element 60 at the stage where the temperature is expected to rise thereafter.

Thus, it is possible to realize more stable temperature management than in a case where a method of driving the cooling element 60 in accordance with a temperature detection result is adopted. Alternatively, it is also possible to realize temperature management with low power consumption, for example, by not driving the cooling element 60 until the heat storage material is completely melted.

7. SUMMARY OF EMBODIMENTS AND MODIFICATION EXAMPLE

The semiconductor device (the semiconductor devices 1, 1A, 1B, 1Ca, 1Cb, 1Cc, 1Cd, 1Da, 1Db, 1E, and 1F) according to the embodiment includes a substrate portion (the substrate portions 21, 21C, 21Cc, 21Cd, 21D, and 21E) on which a semiconductor chip (the semiconductor chip 3) is mounted and in which an external connection terminal (the external connection terminal Et) for performing electrical connection to the outside is formed on a rear surface ($21b$) on a side opposite to a front surface ($21a$) which is a surface on a side where the semiconductor chip is mounted, an outer wall portion (the outer wall portions 22 and 22C, the ceramic frame 22E) that protrudes toward a front surface side in an outer circumferential portion of the substrate portion, a lid portion (the lid portion 4) which is supported by the outer wall portion and covers the semiconductor chip, and a heat storage member (the heat storage member 7) which is disposed at a position further inside than the outer wall portion between the rear surface of the substrate portion and the rear surface of the lid portion.

Thereby, the heat storage member can be disposed to be closer to the semiconductor chip as a heat source, as compared to a case where the heat storage member is externally attached to the semiconductor device or a case where the heat storage member is disposed inside the outer wall portion.

Thus, heat radiation efficiency is improved.

Further, in the semiconductor device according to the embodiment, a substrate portion is formed of ceramic.

Thereby, heat generated from the semiconductor chip is efficiently transferred to the heat storage member through the substrate portion.

Thus, heat radiation efficiency can be improved.

Further, the semiconductor device according to the embodiment includes an inner wall portion (the inner wall portion 22, and the frame members 8 and 9) which is positioned on the inner side of the outer wall portion and protrudes toward a side in the same direction as the outer wall portion, and the heat storage member is formed between the outer wall portion and the inner wall portion.

Thereby, the heat storage material filled in a space between the outer wall portion and the inner wall portion can be sealed by the lid portion.

Thus, the heat storage material undergoing a phase transition in accordance with temperature can be used without being contained in microcapsules or covered with a resin, and heat radiation efficiency can be improved.

Further, in the semiconductor device according to the embodiment, the inner wall portion is formed by a frame member (the frame member 9) provided on the semiconductor chip.

Thereby, a portion of the semiconductor chip can be covered with the heat storage member.

Thus, it is possible to dispose the heat storage member at a position closer to a heat source, increase the capacity of the heat storage member, and further improve heat radiation efficiency.

Further, in the semiconductor device according to the embodiment, the semiconductor chip includes a pixel region (the pixel region 3a) in which a plurality of light receiving elements are arranged two-dimensionally, and the frame member surrounds the outer side of the pixel region on the semiconductor chip.

Thereby, a portion of the outer side of the pixel region on the semiconductor chip can be covered with the heat storage member.

Thus, regarding the semiconductor device as a solid state imaging element, it is possible to improve heat radiation efficiency while making it possible to generate a captured image signal having a predetermined number of pixels.

Further, in the semiconductor device according to the embodiment, the heat storage member is disposed at a position further inside than the outer wall portion inside the substrate portion.

Most of heat generated from the semiconductor chip is transferred to the substrate portion.

Thus, the heat storage material is disposed at a position further inside than the outer wall portion inside the substrate portion as described above, and thus it is possible to improve heat radiation efficiency.

Further, in the semiconductor device according to the embodiment, the substrate portion has a multi-layered structure, and the heat storage member is formed in a notch portion formed in any one layer in the substrate portion (see FIGS. 12A, 12B, 12C, and 12D).

Thereby, a portion to be filled with the heat storage material can be easily formed in a process.

Thus, it is possible to simplify a semiconductor device creating process in improving heat radiation efficiency and reduce costs accompanying an improvement in the efficiency of a creating process.

Further, in the semiconductor device according to the embodiment, the substrate portion has a multi-layered structure, and the heat storage member is formed as a plurality of layers in the substrate portion.

Thereby, a portion restricted by a wiring layout due to the arrangement of the heat storage member in the substrate portion is prevented from being biased to a single layer.

Thus, it is possible to improve the degree of freedom of a wiring layout in the substrate portion.

Further, in the semiconductor device according to the embodiment, a concave portion (the concave portion 21h) recessed on a front surface side is formed on the side of a rear surface of the substrate portion, an electronic component (the electronic components 50 and 51) different from the semiconductor chip is mounted in the concave portion, and the electronic component is covered with the heat storage member in the concave portion.

Thereby, in a case where an electronic component serving as a heat source is mounted on each of both the front and rear surfaces of the substrate portion as an interposer substrate, heat generated from the electronic components is efficiently transferred to the heat storage material through the substrate portion. Thus, appropriate heat countermeasures can be taken for semiconductor device in which the electronic components are mounted on both the front and rear surfaces of the substrate portion, and heat radiation efficiency can be improved.

Further, the semiconductor device according to the embodiment includes a closing member (the closing member 25) that closes the concave portion.

Thereby, the heat storage material undergoing a phase transition in accordance with temperature can be used without being contained in microcapsules or covered with a resin.

Thus, heat radiation efficiency can be improved.

In addition, the semiconductor device according to the embodiment includes a cooling element (the cooling element 60) disposed at a position facing the semiconductor chip on the rear surface side of the substrate portion.

With the above-described configuration, heat generated from the semiconductor chip is efficiently transferred to the cooling element through the substrate portion.

Thus, it is possible to improve the efficiency of temperature control using the cooling element and reduce power consumption required during cooling. In particular, it is possible to reduce power consumption required during cooling.

Further, in the semiconductor device according to the embodiment, the heat storage member is disposed between the cooling element and the semiconductor chip.

Thereby, heat transfer from the semiconductor chip to the cooling element is efficiently performed through the heat storage member positioned between the cooling element and the semiconductor chip.

Thus, it is possible to further improve the efficiency of temperature control using the cooling element.

Further, the semiconductor device according to the embodiment is configured such that the heat storage member is constituted by a heat storage material undergoing a phase transition in accordance with temperature, and includes a detection element that detects a phase transition of the heat storage member (the phase transition detection unit 112) and the cooling element.

Thereby, it is possible to perform temperature management by driving the cooling element on the basis of a phase transition of the heat storage material, for example, by changing a driving mode of the cooling element in accordance with a phase transition timing of the heat storage material.

Thus, the cooling element can be driven early from the stage where temperature is expected to rise due to a phase transition of the heat storage material to start cooling before temperature rises actually, and thus it is possible to realize stable temperature management. In addition, as compared to a case where cooling is started after temperature rises actually, power required for cooling can be reduced, and power saving can also be achieved.

In addition, an imaging device (the imaging devices 100 and 100F) according to an embodiment includes a solid state imaging element (the semiconductor devices 1, 1A, 1B, 1Ca, 1Cb, 1Cc, 1Cd, 1Da, 1Db, 1E, and 1F) and a signal processing unit (the signal processing unit 102). The solid state imaging element includes a substrate portion on which a semiconductor chip having a plurality of light receiving elements arranged two-dimensionally is mounted and in which an external connection terminal for performing electrical connection to the outside is formed on a rear surface on a side opposite to a front surface which is a surface on a side where the semiconductor chip is mounted, an outer wall portion that protrudes toward the front surface side in an outer circumferential portion of the substrate portion, a lid portion which is supported by the outer wall portion and covers the semiconductor chip, and a heat storage member which is disposed at a position further inside than the outer wall portion between the rear surface of the substrate portion and the rear surface of the lid portion. The signal processing unit processes a captured image signal obtained by the solid state imaging element.

Thereby, it is possible to realize the imaging device on which the solid state imaging element capable of obtaining the same operations and effects as those of the above-described semiconductor device according to the embodiment is mounted.

In addition, a method of manufacturing the semiconductor device according to the embodiment is a method of manufacturing a semiconductor device that includes a substrate portion on which a semiconductor chip is mounted and in which an external connection terminal for performing electrical connection to an outside is formed on a rear surface on a side opposite to a front surface which is a surface on a side where the semiconductor chip is mounted, an outer wall portion that protrudes toward the front surface side in an outer circumferential portion of the substrate portion, and a lid portion which is supported by the outer wall portion and covers the semiconductor chip, and a heat storage member is formed at a position further inside than the outer wall portion between the rear surface of the substrate portion and the rear surface of the lid portion.

The above-described semiconductor device according to the embodiment can be manufactured by such a manufacturing method.

Meanwhile, in the above description, an example in which a package formed of ceramic is used as a semiconductor package has been described, but the present technology can also be suitably applied to, for example, a semiconductor package having a cavity structure in which a side wall is formed of a resin material on a laminated substrate formed of an organic material.

In addition, the above-described configurations according to the embodiments can be combined with each other.

Meanwhile, the effects described in this specification are merely examples and are not limited thereto, and there may be other effects.

8. PRESENT TECHNOLOGY

Meanwhile, the present technology can also adopt the following configuration.

(1)
A semiconductor device including:
a substrate portion on which a semiconductor chip is mounted and in which an external connection terminal for performing electrical connection to an outside is formed on a rear surface on a side opposite to a front surface which is a surface on a side where the semiconductor chip is mounted;
an outer wall portion that protrudes toward the front surface side in an outer circumferential portion of the substrate portion;
a lid portion which is supported by the outer wall portion and covers the semiconductor chip; and
a heat storage member which is disposed at a position further inside than the outer wall portion between the rear surface of the substrate portion and a rear surface of the lid portion.

(2)
The semiconductor device according to (1), wherein the substrate portion is formed of ceramic.

(3)
The semiconductor device according to (1) or (2), further including:
an inner wall portion which is positioned on an inner side of the outer wall portion and protrudes toward a side in the same direction as the outer wall portion, wherein the heat storage member is formed between the outer wall portion and the inner wall portion.

(4)
The semiconductor device according to (3), wherein the inner wall portion is formed by a frame member provided on the semiconductor chip.

(5)
The semiconductor device according to (4), wherein
the semiconductor chip includes a pixel region in which a plurality of light receiving elements are arranged two-dimensionally, and
the frame member surrounds an outer side of the pixel region on the semiconductor chip.

(6)
The semiconductor device according to any one of (1) to (5), wherein the heat storage member is disposed at a position further inside than the outer wall portion inside the substrate portion.

(7)
The semiconductor device according to (6), wherein
the substrate portion has a multi-layered structure, and
the heat storage member is formed in a notch portion formed in any one layer in the substrate portion.

(8)
The semiconductor device according to (6) or (7), wherein
the substrate portion has a multi-layered structure, and
the heat storage member is formed in a plurality of layers in the substrate portion.

(9)
The semiconductor device according to any one of (1) to (8), wherein
a concave portion recessed on a front surface side is formed on the rear surface side of the substrate portion,
an electronic component different from the semiconductor chip is mounted in the concave portion, and
the electronic component is covered with the heat storage member in the concave portion.

(10)
The semiconductor device according to (9), further including:
a closing member that closes the concave portion.

(11)
The semiconductor device according to any one of (1) to (10), further including:
a cooling element which is disposed at a position facing the semiconductor chip on the rear surface side of the substrate portion.

(12)
The semiconductor device according to (11), wherein the heat storage member is disposed between the cooling element and the semiconductor chip.

(13)
The semiconductor device according to any one of (1) to (12), wherein
the heat storage member is constituted by a heat storage material undergoing a phase transition in accordance with temperature, and
the semiconductor device includes a detection element that detects a phase transition of the heat storage member, and a cooling element.

REFERENCE SIGNS LIST 1, 1A, 1B, 1C (1Ca, 1Cb, 1Cc, 1Cd), 1D (1Da, 1Db), 1E, 1F Semiconductor device
2, 2A, 2B, 2C (2Ca, 2Ca', 2Cb, 2Cc, 2Cd, 2Ce), 2D, 2E, 2D, 2E Semiconductor package
2' Package base material
2a Concave portion (inner cavity)

2b Concave portion (outer cavity)
2g Green sheet
21, 21C, 21Cc, 21Cd, 21D, 21E Substrate portion
21a Front surface
21b Rear surface
21h Concave portion
22, 22C Outer wall portion
22E Ceramic frame
23 Inner wall portion
3 Semiconductor chip
3a Pixel region
4 Lid portion
7 Heat storage member
8, 9 Frame member
10, 10D, 10E To-be-filled portion
10a Injection port
Et External connection terminal
50, 51 Electronic component
25 Closing member
60 Cooling element
100, 100F Imaging device
102 Signal processing unit
103 Control unit
112 Phase transition detection unit

The invention claimed is:
1. A semiconductor device, comprising:
a substrate portion in which an external connection terminal is on a rear surface of the substrate portion, wherein the rear surface is opposite to a front surface of the substrate portion;
a semiconductor chip that mounts on the substrate portion;
an outer wall portion that protrudes toward a side of the front surface in an outer circumferential portion of the substrate portion;
a lid portion which covers the semiconductor chip, wherein the outer wall portion supports the lid portion; and
a heat storage member which at a position further inside than the outer wall portion-between the rear surface of the substrate portion and a rear surface of the lid portion,
wherein the heat storage member fills a space that the lid portion seals,
an electronic component different from the semiconductor chip is included in the space, and
the heat storage member covers the electronic component in the space.
2. The semiconductor device according to claim 1, wherein the substrate portion is made up of a ceramic material.
3. The semiconductor device according to claim 1, further comprising an inner wall portion which is on an inner side of the outer wall portion and protrudes towards a direction in which the outer wall portion protrudes,
wherein the heat storage member is formed between the outer wall portion and the inner wall portion.
4. The semiconductor device according to claim 3, wherein a frame member on the semiconductor chip forms the inner wall portion.
5. The semiconductor device according to claim 4, wherein the semiconductor chip includes a pixel region which includes a plurality of light receiving elements in a two-dimensional arrangement, and
the frame member surrounds an outer side of the pixel region on the semiconductor chip.
6. The semiconductor device according to claim 3, wherein an inner wall portion is a frame member in contact with the semiconductor chip.
7. The semiconductor device according to claim 1, wherein the heat storage member is at a position further inside than the outer wall portion inside the substrate portion.
8. The semiconductor device according to claim 7, wherein
the substrate portion has a multi-layered structure, and
the heat storage member is in a notch portion included in a layer of the substrate portion.
9. The semiconductor device according to claim 7, wherein
the substrate portion has a multi-layered structure, and
the heat storage member is formed in a plurality of layers of the substrate portion.
10. The semiconductor device according to claim 1, wherein
the space is a concave portion that recesses on the side of the front surface of the substrate portion.
11. The semiconductor device according to claim 10, further comprising a closing member that closes the concave portion.
12. The semiconductor device according to claim 1, further comprising a cooling element which is at a position that faces the semiconductor chip on a side of the rear surface of the substrate portion.
13. The semiconductor device according to claim 12, wherein the heat storage member is between the cooling element and the semiconductor chip.
14. The semiconductor device according to claim 1, wherein
the heat storage member is made up of a heat storage material that undergoes a phase transition in accordance with temperature of the heat storage material, and
the semiconductor device includes a detection element that detects the phase transition of the heat storage member.
15. An imaging device, comprising:
a solid state imaging element that captures an image signal; and
a signal processing unit that processes the captured image signal,
wherein the solid state imaging element includes:
a substrate portion in which an external connection terminal is on a rear surface of the substrate portion, wherein the rear surface is opposite to a front surface of the substrate portion;
a semiconductor chip that mounts on the substrate portion and includes a plurality of light receiving elements in a two-dimensional arrangement;
an outer wall portion that protrudes toward a side of the front surface side in an outer circumferential portion of the substrate portion,
a lid portion which covers the semiconductor chip, wherein the outer wall portion supports the lid portion; and
a heat storage member which is at a position further inside than the outer wall portion between the rear surface of the substrate portion and a rear surface of the lid portion,
wherein the heat storage member fills a space that the lid portion seals,
an electronic component different from the semiconductor chip is included in the space, and the heat storage member covers the electronic component in the space.

16. A method of manufacturing a semiconductor device, comprising:
- mounting a semiconductor chip on a side of a front surface of a substrate portion of the semiconductor device;
- forming an external connection terminal on a side of a rear surface of the substrate portion, wherein the rear surface is opposite to the front surface;
- protruding an outer wall portion towards the side of the front surface in an outer circumferential portion of the substrate portion, wherein the outer wall portion supports a lid portion;
- covering the semiconductor chip by the lid portion; and
- forming a heat storage member at a position further inside than the outer wall portion between the rear surface of the substrate portion and a rear surface of the lid portion,
  - wherein the heat storage member fills a space that the lid portion seals,
  - an electronic component different from the semiconductor chip is included in the space, and
  - the heat storage member covers the electronic component in the space.

* * * * *